United States Patent [19]

Enda

[11] Patent Number: 5,889,687
[45] Date of Patent: Mar. 30, 1999

[54] SIMULATOR, SIMULATION AND FABRICATION METHODS OF SEMICONDUCTOR DEVICE AND STORAGE MEDIUM STORING PROGRAM FOR EXECUTING THE SIMULATION METHOD

[75] Inventor: Toshiyuki Enda, Kanagawa-ken, Japan

[73] Assignee: Kabushiki Kaisha Toshiba, Kawasaki, Japan

[21] Appl. No.: 61,867

[22] Filed: Apr. 17, 1998

[51] Int. Cl.$^6$ .................................................. G06F 17/00
[52] U.S. Cl. .......................... 364/578; 364/488; 364/489; 364/490; 364/491
[58] Field of Search ................... 364/488, 489, 364/490, 491, 578

[56] References Cited

U.S. PATENT DOCUMENTS

| 5,103,415 | 4/1992 | Omura et al. ............................. 364/578 |
| 5,627,772 | 5/1997 | Sonoda et al. ........................... 364/578 |
| 5,684,723 | 11/1997 | Nakadai .................................. 364/578 |

OTHER PUBLICATIONS

Rorris et al., "A New Approach to the Simulation of the Coupled Point Defects and Impurity Diffusion" IEEE Transactions on Computer–Aided Design, pp. 1113–1112. Oct. 1990.

Klaassen, "A Unified mobility Model for Device Simulation", 1990 IEEE, pp. 14.3.1–14.3.4, Apr. 1990.

Siegfried Selberherr, "Analysis and Simulation of Semiconductor Devices", Chapter 4, *The Physical Parameters*, pp. 80–103.

Siegfried Selberherr, "Analysis and Simulation of Semiconductor Devices", Chapter 6, *The Discretization of the Basic Semiconductor Equations*, pp. 149–175.

(List continued on next page.)

Primary Examiner—Kevin J. Teska
Assistant Examiner—A. S. Roberts
Attorney, Agent, or Firm—Foley & Lardner

[57] ABSTRACT

The present invention provides a device simulation method comprising at least the steps of: inputting a geometry of a semiconductor device, a donor and an acceptor impurity concentrations at each point inside the semiconductor device and also terminal voltages of the semiconductor device (step S101); setting initial values by obtaining electron concentrations n$_I$ and n$_J$ and also hole concentrations p$_I$ and p$_J$ with respect to given points I and J respectively inside the semiconductor device and also a potential at each point (step S102); obtaining a voltage difference $\Psi_{dd}$ across a prescribed segment dd along a segment IJ connecting the points I and J (step S103); calculating an electron current density $J_{eIJ}$ of the segment IJ by an equation $J_{eIJ}=C_{eI}\cdot A(\Phi_{edd})-C_{eJ}\cdot A(-\Phi_{edd})$ using a constant $C_{eI}$ dependent on the electron concentration n$_I$, a constant $C_{eJ}$ dependent on the electron concentration n$_J$, and a voltage difference ($\Phi_{edd}=\Psi_{dd}/NV_e$) across the segment dd normalized by an electron's thermal voltage ($NV_e=k\cdot T_e/(-q)$) (step S104); calculating a hole current density $J_{hIJ}$ of the segment IJ by an equation $J_{hIJ}=C_{hI}\cdot A(\Phi_{hdd})-C_{hJ}\cdot A(-\Phi_{hdd})$ using a constant $C_{hI}$ dependent on the hole concentration p$_I$, a constant $C_{hJ}$ dependent on the hole concentration p$_J$, and a voltage difference (($\Phi_{hdd}=\Psi_{dd}/NV_h$) across the segment dd normalized by a hole's thermal voltage ($NV_h=k\cdot T_h/q$) (step S105); and outputting a terminal current, where $A(\Phi)=1/(\exp(\Phi)+1)$. The present invention provides also a device simulator that can perform this device simulation method for fabricating semiconductor devices, and a storage medium storing the program to perform this device simulation method. The present invention further provides a device fabrication method employing the device simulation method.

31 Claims, 10 Drawing Sheets

OTHER PUBLICATIONS

Siegfried Selberherr, "Analysis and Simulation of Semiconductor Devices", Chapter 7, *The Solution of Systems of Nonlinear Algebraic Equations*, pp. 203–213.

Noritoshi Konishi, et al., "Development of Low Temperature Device Simulator Based on Universality Mobility Model", *Technical Report of IEICE*, SDM92–93, VLD92–68, 1992–10.

D.L. Scharfetter, et al., "Large–Signal Analysis of a Silicon Read Diode Oscillator", *IEEE Transactions on Electron Devices*, vol. ED–16, No. 1, pp. 64–77, Jan. 1969.

Woo–Sung Choi, et al., "A Time Dependent Hydrodynamic Device Simulator SNU–2D With New Discretion Scheme and Algorithm", *IEEE Transactions on Computer–Aided Design of Integrated Circuits and Systems*, vol. 13, No. 7, pp. 899–908, Jul. 1994.

SIMULATOR, SIMULATION AND FABRICATION METHODS OF SEMICONDUCTOR DEVICE AND STORAGE MEDIUM STORING PROGRAM FOR EXECUTING THE SIMULATION METHOD

NOMENCLATURE

| | |
|---|---|
| q | Elementary charge |
| B(x) | Bernoulli's function (B(x) = x/(exp(x) − 1)) |
| $T_e$ | Electron temperature |
| $T_h$ | Hole temperature |
| k | Boltzmann's constant |
| $NV_e$ | Thermal voltage of electron ($NV_e = k \cdot T_e/(-q)$) |
| $NV_h$ | Thermal voltage of hole ($NV_h = k \cdot T_h/q$) |
| $\psi$ | Potential |
| $\psi_m$ | Potential at point m (m = I, J, ...) |
| $\psi_{dd}$ | Voltage difference across prescribed segment dd along segment IJ |
| $\psi_{IJ}$ | Voltage difference across segment IJ ($\psi_{IJ} = \psi_J - \psi_I$) |
| $\psi^\lambda_e$ | Voltage difference across electron mean free path |
| $\psi^\lambda_h$ | Voltage difference across hole mean free path |
| $\Phi_{edd}$ | Voltage difference across segment dd normalized by thermal voltage of electron ($\Phi_{edd} = \psi_{dd}/NV_e$) |
| $\Phi_{hdd}$ | Voltage difference across segment dd normalized by thermal voltage of hole ($\Phi_{hdd} = \psi_{dd}/NV_h$) |
| n | Electron concentration |
| p | Hole concentration |
| $n_m$ | Electron concentration at point m (m = I, J, ..., I', J', ...) |
| $p_m$ | Hole concentration at point m (m = I, J, ... I', J', ...) |
| E | Electric field |
| $E_{IJ}$ | Electric field measured from point I to point J |
| $J_e$ | Electron current density |
| $J_h$ | Hole current density |
| $J_{eIJ}$ | Electron current density measured from point I to point J |
| $J_{hIJ}$ | Hole current density measured from point I to point J |
| $d_{IJ}$ | Distance of segment IJ interconnecting polygonal points I and J |
| $\mu_{eIJ}$ | Electron mobility along segment IJ |
| $\mu_{hIJ}$ | Hole mobility along segment IJ |
| $\mu_{ewIJ}$ | Low field electron mobility along segment IJ |
| $\mu_{hwIJ}$ | Low field hole mobility along segment IJ |
| $\mu_e(W)$ | Electron mobility having energy W |
| $\mu_h(W)$ | Hole mobility having energy W |
| $S_{eIJ}$ | Electron energy flux density |
| $S_{hIJ}$ | Hole energy flux density |
| $Q_e$ | Effective flow factor for electron |
| $Q_h$ | Effective flow factor for hole |
| $V_{esat}$ | Saturation drift velocity of electron |
| $V_{hsat}$ | Saturation drift velocity of hole |
| $V_{esatm}$ | Electron saturation drift velocity at point m (m = I, J, ...) |
| $V_{hsatm}$ | Hole saturation drift velocity at point m (m = I, J, ...) |
| $n_i$ | Intrinsic carrier concentration of semiconductor |
| $N_D$ | Donor impurity concentration |
| $N_A$ | Acceptor impurity concentration |
| $F_{eIJ}$ | Proportional coefficient of electron current density $J_{eIJ}$ |
| $F_{hIJ}$ | Proportional coefficient of hole current density $J_{hIJ}$ |
| $F_{em}$ | Proportional coefficient of electron current density $J_{eIJ}$ at point m (m = I, J, ... I', J', ...) |
| $F_{hm}$ | Proportional coefficient of hole current density $J_{hIJ}$ at point m (m = I, J, ... I', J', ...) |
| $G_{eI}'$ | Proportional coefficient of electron energy flux density $S_{eIJ}$ for electron concentration at point I' |
| $G_{eJ}'$ | Proportional coefficient of electron energy flux density $S_{eIJ}$ for electron concentration at point J' |
| $G_{hI}'$ | Proportional coefficient of hole energy flux density $S_{hIJ}$ for hole concentration at point I' |
| $G_{hJ}'$ | Proportional coefficient of hole energy flux density $S_{hIJ}$ for hole concentration at point J' |
| $\lambda_e$ | Electron mean free path |
| $\lambda_h$ | Hole mean free path |
| $V_{eTH}$ | Thermal velocity of electron |
| $V_{hTH}$ | Thermal velocity of hole |
| $V_{eTHm}$ | Thermal velocity of electron at point m (m = I', J', ...) |
| $V_{hTHm}$ | Thermal velocity of hole at point m (m = I', J', ...) |
| $\tau_e$ | Electron momentum relaxation time |
| $\tau_h$ | Hole momentum relaxation time |
| $m^*_e$ | Effective mass of electron |
| $m^*_h$ | Effective mass of hole |

BACKGROUND OF THE INVENTION

1. Field of the Invention

The present invention relates in general to a fabrication method, a performance evaluator, and a performance evaluation method of semiconductor devices and a storage medium from which the semiconductor device behavior evaluation program can be read out and more particularly to numerical calculations for electrical characteristics of semiconductor devices, i.e., a device simulation method and also to the technologies of fabricating LSIs and other semiconductor devices by use of this device simulation method.

2. Description of the Related Art

It requires a number of processes to fabricate LSIs, high-frequency transistors, power transistors, light-emitting devices, or other semiconductor devices. At the design stage for semiconductor devices out of these processes, it is necessary to check whether the size and the impurity concentrations of a designed semiconductor device satisfy specified requirements, so that the various performances of the semiconductor device having the designed size and these concentrations must be evaluated.

For the recent complicated semiconductor devices having high integration densities, the direct performance evaluation on the real chip of the device is undesirable because it requires too much time and cost and may contain faulty results. Therefore, in the process of fabricating an LSI or other fine-patterned semiconductor device with a high integration density, the physical and electrical behaviors of the semiconductor device to be fabricated are generally simulated on a computer system at first that are ruled by almost the same laws as those behaviors in the real semiconductor device. Thus simulated semiconductor device is then evaluated for its performance before it is actually started to be fabricated.

However, if a considerable amount of errors are contained in the performance evaluation results of simulation by the computer system, some faults will of course occur in the real fabrication steps of the semiconductor device. If, for example, a trial product is finished after a few weeks or longer of complicated fabrication processes and then detected to be faulty, the device must be redesigned and undergo such time consuming and complicated fabrication processes, thus bringing about much waste in time and running cost. It is, therefore, very important to improve the simulation accuracy in order to, for example, reduce efficiently the period of semiconductor device fabrication. It should be noted that the time lost by faulty design cannot be recovered. Particularly in the semiconductor industry, where the competitors are earnestly developing higher-performance devices, the most important factor is the speed of developing, so that it is extremely important to reduce the time for design and development.

An apparatus (device simulator) used in the processes of evaluating the behavior of semiconductor devices will receive as input data the geometries of a semiconductor device to be fabricated, its impurity distribution profiles, and voltages applied at its terminals and execute software programs to output its electrical characteristics (see Chap.6. The Discretization of the Basic Semiconductor Equations and Chap.7. The solution of Systems of Nonlinear Algebraic Equations in S.Selberherr in *Analysis and Simulation of Semiconductor Devices*, Springer-Verlag, Wien New York, (1984): herinafter called "Selberherr's method").

A device simulator obtains, by numerical calculations, the solutions of the Poisson's equations and the continuity equations for electron currents and hole currents, which are the basic equations for the electrical characteristics of semiconductors, thereby evaluating the behavior of a designed semiconductor device. These basic equations are simultaneous differential equations of a potential distribution, a electron concentration distribution, and a hole concentration distribution. With this, arbitrary values are first given to the potential $\Psi$, to the electron concentration n, and to the hole concentration p at each point constituting polygons in a semiconductor device to be fabricated, so that then, these values are modified to provide satisfactory solutions until those values satisfy the above-mentioned equations.

To determine the points at which the potential $\Psi$, the electron concentration n, and the hole concentration p are calculated, the geometry of a semiconductor device is expressed in an aggregate of polygons as shown at the upper part in FIG. 1. FIG. 1 shows a structure of the vicinity of the gate electrode of an MOSFET, in which a small horizontal rectangle G represents the gate electrode. The grid-shaped part below the gate electrode G corresponds to a channel region. Two small vertical rectangles S and D on both sides of the gate electrode correspond to source and drain electrodes respectively. Those polygons do no overlap each other and, at the same time, fill out the geometry of the semiconductor without-empty spaces. In device simulation, therefore, the potential $\Psi$, the electron concentration n, and the hole concentration p are calculated at each vertex (filled circle in the figure) of the polygons. Also, since the basic equations are differential ones, those three parameters must be differentiated. These differentiated values are calculated for each segment of those polygons. Specifically, the potential $\Psi$ is differentiated into an electric field E, the electron concentration n is differentiated into an electron current density $J_e$, and the hole concentration p is differentiated into a hole current density $J_h$ for each segment.

According to the prior art, the electron current density $J_e$ and the hole current density $J_p$ are calculated for each segment of the polygon according to the following steps:

(a) Substitute a length $d_{IJ}$ of a segment IJ connecting arbitrary points of polygon (which are assumed as points I and J) into a program variable (which is assumed as DISTIJ).

(b) Substitute a potential $\Psi_I$, an electron concentration $n_I$, and a hole concentration $p_I$ at one end point I of the segment IJ into program variables. They are here written as $\Psi_I$, NI, and PI respectively.

(c) Substitute a potential $\Psi_J$, an electron concentration $n_J$, and a hole concentration $p_J$ at the other end point of the segment IJ into program variables. They are here written as $\Psi_J$, NJ, and PJ respectively.

(d) Calculate an electric field $E_{IJ}$ going from the point I to the point J using the following equation and substitute it into the program variable EIJ.

$$E_{IJ} = -\Psi_{IJ}/d_{IJ} \qquad (1)$$

(e) Obtain an electron mobility $\mu_{eIJ}$ along the segment IJ as a function of the variable EIJ, i.e., of the electric field $E_{IJ}$ and substitute it into the program variable MEIJ. Note here that the electron mobility $\mu_{eIJ}$ can be obtained several ways. For example, the electron mobility $\mu_{eIJ}$ can be obtained beforehand as a function of the electric field $E_{IJ}$ experimentally, to store the experiment results in a table into a memory of the computer. Alternately, the electron mobility $\mu_{eIJ}$ can be calculated as a function of the electric field $E_{IJ}$ by using equations that approximately reproduce the experiment results.

(f) Calculate an electron current density $J_{eIJ}$ going from the point I to the point J with the following equation (2) and substitute it into the program variable JHIJ.

$$J_{eIJ} = -q\mu_{eIJ} \cdot NV_e \cdot (B(\Psi_{IJ}/NV_e) \cdot n_I - B(-\Psi_{IJ}/NV_e) \cdot n_J)/d_{IJ} \qquad (2)$$

where $\mu_{eIJ}$ is a negative value.

(g) Obtain a hole mobility $\mu_{hIJ}$ along the segment IJ as a function of the variable EIJ and substitute it into the program variable MHIJ. The hole mobility $\mu_{hIJ}$ is obtained the same way as the electron mobility $\mu_{eIJ}$.

(h) Calculate the hole current density $J_{hIJ}$ going from the point I to the point J with the following equation (3) and substitute it into the program variable JHIJ.

$$J_{hIJ} = q\mu_{hIJ} \cdot NV_h \cdot (B(\Psi_{IJ}/NV_h) \cdot p_I - B(-\Psi_{IJ}/NV_h) \cdot p_J)/d_{IJ} \qquad (3)$$

According to the above procedure, arbitrary values of potentials $\Psi_I$ and $\Psi_J$, electron concentrations $n_I$ and $n_J$, and hole concentrations $p_I$ and $p_J$ are given to each vertex of the polygon, to calculate the electric field $E_{IJ}$, the electron current density $J_{eIJ}$, and the hole current density $J_{hIJ}$. If the distribution of these six physical quantities does not satisfy the basic equations, the potentials, the electron concentrations, and the hole concentrations at each vertex are modified, to calculate the electric field, the electron current density, and the hole current density again. This modification is carried out by, for example, the Newton method. By repeating this modification, solutions satisfying the basic equations can be calculated with a sufficient accuracy.

The above-mentioned method is based on the assumption that the electron temperature $T_e$ and the hole temperature $T_h$ are equal to the crystal-lattice temperature of the semiconductor constituting a semiconductor device. This assumption is valid in many situations. In fine-patterned semiconductor device, however, electrons and holes are so heated that the above-mentioned assumption may be invalid.

In such a case, an electron energy flux continuity equation and a hole energy flux continuity equation are added to the above-mentioned equations to provide five basic equations. Using these five equations, the solution can be obtained numerically, to evaluate the electrical behavior of the designed semiconductor device (see, for example, Woo-Sung Choi, Jae-Gyung Ahn, Young-June Park, Hong-Shick Min, and Chang-Gyu Hwang, "A Time Dependent Hydrodynamic Device Simulator SNU-2D with New Discretization Scheme and Algorithm," IEEE Transactions on Computer-Aided Design of Integrated Circuits and Systems, Vol. 13, No. 7, July, (1994)). The prior art of this method is described below.

By the prior art, the electron current density, the hole current density, the electron energy flux density, and the hole energy flux density along each segment of a polygon are calculated according to the following procedure:

(Step 1) Substitute a length $d_{IJ}$ of a segment IJ connecting points (which are assumed as points I and J) of a given polygon into a program variable (which is assumed as DISTIJ).

(Step 2) Substitute a potential $\Psi_I$, an electron concentration $n_I$, a hole concentration $p_I$, an electron temperature $T_{eI}$, and a hole temperature $T_{hI}$ at one end point of the segment IJ into program variables. They are here written as ΨI, NI, PI, TEI, and THI respectively.

(Step 3) Substitute a potential $\Psi_J$, an electron concentration $n_J$, a hole concentration $p_J$, an electron temperature $T_{eJ}$, and a hole temperature $T_{hJ}$ at the other end point of the segment IJ into program variables. They are here written as ΨJ, NJ, PJ, TEJ, and THJ.

(Step 4) Calculate an electric field $E_{IJ}$ going from the point I to the point J using the above-mentioned equation (1) and substitute it into the program variable EIJ.

(Step 5) Obtain an electron mobility $\mu_{eIJ}$ along the segment IJ as a function of the variable EIJ, i.e., the electric field $E_{IJ}$ and substitute it into the program variable MEIJ. Note here that the electron mobility $\mu_{eIJ}$ can be obtained several ways. For example, the electron mobility $\mu_{eIJ}$ can be obtained beforehand as a function of the electric field experimentally, to store the experiment results in a table into a memory of the computer. Alternately, the electron mobility can be calculated as a function of the electric field with an equation that reproduces the experiment results approximately.

(Step 6) Calculate an electron current density $J_{eIJ}$ going from the point I to the point J using the following equation (4) and substitute it into the program variable JEIJ.

$$J_{eIJ} = -q \cdot \mu_{eIJ} \cdot NV_e \cdot (\Delta T_e/(d_{IJ} \cdot \log(T_{eJ}/T_{eI}))) \cdot \quad (4)$$
$$(B(BARG^e) \cdot (n_I/T_{eI}) - B(-BARG^e) \cdot (n_J/T_{eJ}))$$

where the following equations hold true.

$$\Delta T_e = T_{eJ} - T_{eI} \quad (5)$$

$$BARG^e = (\log (T_{eJ}/T_{eI})/\Delta T_e) \cdot ((-q/k) \cdot \Psi_{IJ} + 2\Delta T_e) \quad (6)$$

(Step 7) Obtain the hole mobility $\mu_{hIJ}$ along the segment IJ as a function of the variable EIJ and substitute it into the program variable MHIJ. The hole mobility $\mu_{hIJ}$ can be obtained the same way as the electron mobility $\mu_{eIJ}$.

(Step 8) Calculate the hole current density going from the point I to the point J with the following equation (7) and substitute it into the program variable JHIJ.

$$J_{hIJ} = q \cdot \mu_{eIJ} \cdot NV_h \cdot (\Delta T_h/(d_{IJ} \cdot \log(T_{hJ}/T_{hI}))) \cdot \quad (7)$$
$$(B(BARG^h) \cdot (p_I/T_{hI}) - B(-BARG^h) \cdot (p_J/T_{hJ}))$$

where the following equations hold true.

$$\Delta T_h = T_{hJ} - T_{hI} \quad (8)$$

$$BARG^h = (\log (T_{hJ}/T_{hI})/\Delta T_h) \cdot ((q/k) \cdot \Psi_{IJ} + 2\Delta T_h) \quad (9)$$

(Step 9) Calculate the electron energy flux density $S_{eIJ}$ going from the point I to the point J with the following equation (10) and substitute it into the program variable SEIJ.

$$S_e = Q_e \cdot k \cdot \mu_{eIJ} \cdot NV_e \cdot (\Delta T_e/(d_{IJ} \cdot \log (T_{eJ}/T_{eI}))) \cdot (B(BARG^e) \cdot n_I - B(-BARG^e) \cdot n_J) \quad (10)$$

(Step 10) Calculate the hole energy flux density $S_{hIJ}$ going from the point I to the point J with the following equation (11) and substitute it into the program variable SHIJ.

$$S_{hIJ} = Q_h \cdot k \cdot \mu_{hIJ} \cdot NV_h \cdot (\Delta T_h/(d_{IJ} \cdot \log (T_{hJ}/T_{hI}))) \cdot (B(BARG^h) \cdot p_I - B(-BARG^h) \cdot p_J) \quad (11)$$

According to the above procedure, arbitrary values of potentials $\Psi_I$ and $\Psi_J$, electron concentrations $n_I$ and $n_J$, hole concentrations $p_I$ and $p_J$, electron temperatures $T_{eI}$ and $T_{eJ}$, and hole temperatures $T_{hI}$ and $T_{hJ}$ are given to each vertex of a polygon, to calculate the electric field $E_{IJ}$, the electron current density $J_{eIJ}$, the hole current density $J_{hIJ}$, the electron energy flux density $S_{eIJ}$, and hole energy flux density $S_{hIJ}$ for each segment. If the distribution of these ten physical quantities do not satisfy the basic equations, the potential, the electron concentration, the hole concentration, the electron temperature, and the hole temperature at each vertex are modified, to calculate the electric field, the electron current density, the hole current density, the electron energy flux density, and the hole energy flux density again. This modification is carried out by use of, for example, the Newton method. By repeating this modification, solutions which satisfy the basic equations with a sufficient accuracy are calculated.

As mentioned above, at the design stage for the fabrication processes of semiconductor devices, by evaluating the electrical behavior of a semiconductor device to be fabricated, faults in design can be detected beforehand and corrected. In such a way, by repeating a series of designing, device behavior evaluation, and re-designing steps, more valid design values can be worked out. By thus employing more accurate and more valid design values, an attempt is made to reduce the fabrication period for semiconductor devices.

A device simulator according to the prior art, however, often suffers a problem that no solutions can be obtained which satisfy the above-mentioned basic equations. This problem causes deterioration in the accuracy of the device simulator, thus increasing the fabrication period greatly. The following will describe the cases of this problem.

When the electric field E is sufficiently weak, the electron and hole current densities $J_e$ and $J_h$ in a semiconductor increase in proportion to the electric field. If the electric field E is strong, however, the current densities are saturated. This is because the drift velocities of electrons and holes in a semiconductor are saturated as follows.

$$J_e = q \cdot V_{esat} \cdot n \quad (12)$$

$$J_h = q \cdot V_{hsat} \cdot p \quad (13)$$

The electron mobility $\mu_e$ and the hole mobility $\mu_h$ are defined as follows.

$$J_e = q \cdot \mu_e \cdot E \cdot n \quad (14)$$

$$J_h = q \cdot \mu_h \cdot E \cdot p \quad (15)$$

FIGS. 3A and 3B show the electron mobility and the hole mobility $\mu_e$ and $\mu_h$ in silicon respectively. When the electric field E is sufficiently strong, the electron mobility $\mu_e$ and the hole mobility $\mu_h$ decrease in inverse proportion to the electric field. This is because the drift velocities of electrons and holes are saturated when the electric field E is sufficiently strong.

The electron current density $J_{eIJ}$ and the hole current density $J_{hIJ}$ as calculated by Equations (2) and (3) respectively are also saturated when the electric field E is strong. However, this holds true when there are no errors in numerical calculations. Actual numerical calculations by use of a computer have some errors. This is because the number of the digits of variables are limited. To obtain correct solutions in numerical calculations, therefore, it is essential to employ such a calculation method that errors in numerical calculations have no significant effects on the calculation results.

The following will describe the fact that the electron current density $J_{eIJ}$ cannot be calculated with a sufficient accuracy by use of Equation (2) because of numeric errors. For the same reason, also, no method using Equation (3) can calculate the hole current density JhJ with a sufficient accuracy.

The value of a program variable MEIJ indicative of the electron mobility $\mu_{eIJ}$ has some numeric errors. To simplify the following explanation, the program variable MEIJ is given as a sum of a variable MEIJ$^{TRUE}$ indicative of the true value of the electron mobility $\mu_{eIJ}$ and a variable MEIJ$^{ERROR}$ indicative of the error as follows.

$$MEIJ = MEIJ^{TRUE} + MEIJ^{ERROR} \qquad (16)$$

Likewise, a numeric error included in a Voltage difference $\Psi_{IJ}$ across the segment IJ is given as follows.

$$\Psi_{IJ} = \Psi_{IJ}^{TRUE} + \Psi_{IJ}^{ERROR} \qquad (17)$$

Next, the program variable JEIJ calculated from Equation (2) is written, as follows, as a sum of the variable JEIJ$^{TRUE}$ indicative of the true value and the variable JEIJ$^{ERROR}$ indicative of the error.

$$JEIJ = JEIJ^{TRUE} + JEIJ^{ERROR} \qquad (18)$$

The electron mobility $\mu_{eIj}$ is obtained from Equation (16) and the Voltage difference $\Psi_{IJ}$ across the segment IJ is obtained from Equation (17) and these values are substituted into Equation (2), to provide the following equation.

$$JEIJ^{ERROR} = -JEIJ^{TRUE} - q \cdot NV_e/d_{IJ} \cdot \qquad (19)$$
$$(MEIJ^{TRUE} + MEIJ^{ERROR}) \cdot (B((\Psi_{IJ}^{TRUE} + \Psi_{IJ}^{ERROR})/NV_e) \cdot n_I -$$
$$B(-(\Psi_{IJ}^{TRUE} + \Psi_{IJ}^{ERROR})/NV_e) \cdot n_J)$$

To indicate the mathematical characteristics of the variable JEIJ$^{ERROR}$ indicative of an error of the electron current density $J_{eIJ}$ given by Equation (19), assume the following situation.

$$-\Psi_{IJ}^{TRUE}/NV_e \gg 1 \qquad (20)$$

$$(MEIJ^{ERROR}/MEIJ^{TRUE})^2 \sim 0 \qquad (21)$$

$$(\Psi_{IJ}^{ERROR}/IJ^{TRUE})^2 \sim 0 \qquad (22)$$

With this, Equation (19) can be approximated as follows.

$$JEIJ^{ERROR} = q/d_{IJ} \cdot (n_I - n_J \cdot \exp(\Psi_{IJ}^{TRUE}/NV_e)) \cdot \qquad (23)$$
$$(MEIJ^{ERROR} \cdot \Psi_{IJ}^{TRUE} + MEIJ^{TRUE} \cdot \Psi_{IJ}^{ERROR})$$

Also, in such a physical situation that the electron drift velocity is saturated, the following equation is established.

$$VSATE^{TRUE} = -MEIJ^{TRUE} \cdot \Psi_{IJ}^{TRUE}/d_{IJ} \qquad (24)$$

where VSATE$^{TRUE}$ is a variable indicating the true value of the electron's saturated drift velocity $v_{esat}$.

Using Equations (2), (23), and (24), in this physical situation, the proportion of the error of the electron current density $J_{eIJ}$ to the true value is as follows.

$$JEIJ^{ERROR}/JEIJ^{TRUE} = \qquad (25)$$
$$-\Psi_{IJ}^{TRUE}/VSATE^{TRUE} \cdot MEIJ^{ERROR}/d_{IJ} -$$
$$MEIJ^{TRUE}/VSATE^{TRUE} \cdot \Psi_{IJ}^{ERROR}/d_{IJ}$$

Defining variables $\alpha$ and $\beta$ by the following equations, Equation (25) is expressed by the following equations (26) through (28).

$$\alpha = \Psi_{IJ}^{TRUE}/VSATE^{TRUE}/d_{IJ} \qquad (26)$$

$$\beta = MEIJ^{TRUE}/VSATE^{TRUE}/d_{IJ} \qquad (27)$$

$$JEIJ^{ERROR}/JEIJ^{TRUE} = -\alpha \cdot MEIJ^{ERRRO} - \beta \cdot \Psi_{IJ}^{ERROR} \qquad (28)$$

The numeric error of the electron current density $J_{eIJ}$ expressed by the left side member of Equation (28) includes an error as much as ($-\alpha$) times the numeric error of the electron mobility $\mu_{eIJ}$. The variable $\alpha$ increases in proportion to a voltage difference across each segment. By the prior art device simulation method, therefore, the numeric error of the electron current density increases in proportion to the magnitude of the electric field. Thus, if a high electric field occurs whose magnitude is in excess of a certain finite value determined by the geometry etc. of a semiconductor device, the resultant numeric error of the electron current density makes it impossible to obtain solutions that satisfy the basic equations with a prescribed accuracy.

To solve this problem, the prior art has a known method that reduce the length of each segment, to minimize the value of $\alpha$. By this method, solutions for the basic equations can be obtained for a higher electric field. This method, however, still cannot obtain solutions if the magnitude of the electric field exceeds a certain value. If, moreover, the segment is reduced in length, a larger number of polygons are required to express a semiconductor. This leads to increases in the number of segments, requiring a huge amount of time and memory capacity in calculation.

SUMMARY OF THE INVENTION

In view of these situations, it is an object of the present invention to provide a performance evaluation method for semiconductor devices that obtains rapidly and stably the device behavior that satisfies a prescribed accuracy, thus reducing the period of designing as well as fabricating the device.

More specifically, the present invention would provide a device behavior evaluation method that can always obtain solutions for the basic equations even with such a higher electric field that gives rise therein to the numeric errors of the electron mobility $\mu_e$ and hole mobility $\mu_h$ in the semiconductor device.

Another object of the present invention is to provide such a device behavior evaluation method that various numeric errors, even if any, in numerical calculations have no significant effects on the calculation results obtained by an actual computer.

A further object of the present invention is to provide a device simulator that can carry out the above-mentioned simulation and evaluation method for semiconductor devices. That is, it is to provide such a device simulator that rapidly and stably obtains a device behavior which satisfies a prescribed accuracy, thus reducing a required period for fabrication.

A still further object of the present invention is to provide a semiconductor-device fabrication method that uses the above-mentioned device simulator to reduce the design period and also the fabrication period of semiconductor devices.

An additional object of the present invention is to provide a storage medium capable of mechanical read-out that stores the simulation and evaluation programs of semiconductor devices to permit the above-mentioned semiconductor-device simulator to evaluate the device behavior satisfying a prescribed accuracy, thus reducing the design period as well as the fabrication period of semiconductor devices.

To achieve the above-mentioned objects, the first feature of the present invention is a semiconductor-device fabrication method that comprises at least the steps of:

(a) designing the geometry of a semiconductor device and both the donor impurity concentration and the acceptor impurity concentration at each point inside the semiconductor device;

(b) evaluating the behavior of the semiconductor device by inputting as well as the terminal voltages of the semiconductor device the designed semiconductor device geometry and the donor and acceptor impurity concentrations at each point in the semiconductor device to obtain the electron and hole concentrations at each point inside the semiconductor device and the voltage difference $\Psi_{dd}$ across a prescribed segment along a segment IJ inside the semiconductor device, thus calculating at least either one of the electron current density $J_{eIJ}$ and the hole current density $J_{hIJ}$ along the segment IJ connecting given points I and J inside the semiconductor device; and (c) fabricating a semiconductor device by a series of fabrication steps including an impurity doping step, a thin film forming step, a photolithography step, and an etching step to realize the above-mentioned geometry of the semiconductor and its donor and acceptor impurity concentrations if desired device behaviors are obtained as a result of the preceding evaluation step (b). For example, "the voltage difference $\Psi_{dd}$ across a prescribed segment dd along a segment IJ inside the semiconductor device" may mean a voltage difference across the segment IJ ($\Psi_{IJ}=\Psi_J-\Psi_I$). Also, it may be a voltage difference $\Psi^{\lambda}_e$ across an electron mean free path $\lambda_e$ for the electron current density $J_{eIJ}$ or a voltage difference $\Psi^{\lambda}_h$ across a hole mean free path $\lambda_h$ for the hole current density $J_{hIJ}$.

The above-mentioned electron current density $J_{eIJ}$ can be calculated by the following equation (29), which uses a constant $C_{eI}$ related to a point I and a constant $C_{eJ}$ related to a point J and a voltage difference ($\Phi^{edd}=\Psi_{dd}/NV_e$) across a segment dd normalized by an electron's thermal voltage ($NV_e=k\cdot T_e/(-q)$).

$$J_{eIJ}=C_{eI}\cdot A(\Phi_{edd})-C_{eJ}\cdot A(-\Phi_{edd}) \quad (29)$$

In this equation, the constant $C_{eI}$ related the point I may depend on the value of an electron concentration $n_I$ at the point I or an electron concentration $n_1'$ at a point I' distant from the point I by a predetermined distance. The predetermined distance may be a distance depending on an elecrtron mean free path $\lambda_e$. Also, the constant $C_{eJ}$ may depend on the value of an electron concentration $n_J$ at the point J or an electron concentration $n_J'$ at a point distant from the point J by a predetermined distance. The predetermined distance may be the distance depending on the elecrtron mean free path $\lambda_e$. These constants $C_{eI}$ and $C_{eJ}$ are further dependent on the electron mobility and the electron's saturation drift velocity or the electron's thermal velocity. Also, the above-mentioned hole current density $J_{hIJ}$ can be calculated by the following equation (30), which uses a constant $C_{hI}$ related to the point I, a constant $C_{hJ}$ related to the point J, and a voltage difference ($\Phi_{hdd}=\Psi_{dd}/NV_h$) across a segment dd normalized by a hole's thermal voltage ($NV_h=k\cdot T_h/q$).

$$J_{hIJ}=C_{hI}\cdot A(\Phi_{hdd})-C_{hJ}\cdot A(-\Phi_{hdd}) \quad (30)$$

In this equation, the constant $C_{hI}$ related to the point I depends on the value of a hole concentration $p_I$ at the point I or a hole concentration $p_I'$ at a point I' distant from the point I by a predetermined distance. The predetermined distance may be a distance depending on a hole mean free path $\lambda_h$. Also, the constant $C_{hJ}$ related to the point J depends on the value of a hole concentration $p_J$ at the point J or a hole concentration $p_J'$ at a point J' distant from the point J by a predetermined distance. The predetermined distance may be the distance depending on the hole mean free path $\lambda_h$. These constants $C_{hI}$ and $C_{hJ}$ are further dependent on the hole mobility and the hole's saturation drift velocity or the hole's thermal velocity. Also, the following equation holds true.

$$A(\Phi)=1/(\exp(\Phi)+1) \quad (31)$$

If a target semiconductor device is a simple diode, it may be enough to calculate only either the electron current density $J_{eIJ}$ or the hole current density $J_{hIJ}$. In the case of a thyrister, a CMOS IC, or a more complicated integrated circuit, it is necessary to calculate both the electron current density $J_{eIJ}$ and the hole current density $J_{hIJ}$. In either case, the electron current density $J_{eIJ}$ and/or the hole current density $J_{hIJ}$ should be selected as required depending on the performance and the design specifications of a target semiconductor device.

In the first feature of the present invention, the step of designing the donor impurity concentration and the acceptor impurity concentration at each point inside a semiconductor device can be carried out by use of a process simulator which employs a computer system or by manual calculations if possible.

According to the first feature of the present invention, it is possible to reduce the design period, in which the design satisfies a prescribed accuracy. And, it is possible to design a semiconductor device accurately, rapidly with stable results, thus evaluating the behavior of a designed semiconductor device. By employing this feature, therefore, possible faults of thus obtained semiconductor device fabricated through a series of fabrication processes including ion implantation, photolithography, and other steps can be prevented and inhibited from occurring beforehand, thus reducing the period for fabricating the semiconductor device.

Also, as for the first feature of the present invention, in such a situation that electrons and holes are heated and, therefore, the presumption that both the electron temperature $T_e$ and the hole temperature $T_h$ are equal to the lattice temperature of a semiconductor is not held any more, the Equations (67) through (72) described later can be used to calculate the electron and hole energy flux densities $S_{eIJ}$ and $S_{hIJ}$ respectively. That is, by obtaining numerically by use of a method of the present invention the solution of the basic equations comprising the electron energy flux continuity expression and the hole energy flux continuity expression, it is possible to rapidly fabricate and realize LSIs having miniaturized feature sizes—in the order of deep sub-microns through nanometers, memories such as EEPROM using the hot-electron injections to write data in, hot-electron devices, or other semiconductor devices using the high field phenomena.

The second feature of the present invention is a semiconductor device simulator that comprises at least (a) an input unit which inputs a geometry of a semiconductor device, a donor impurity concentration and an acceptor impurity concentration at each point inside the semiconductor, and terminal voltages of the semiconductor device; (b) an obtaining unit which obtains an electron concentration and a hole concentration at each point inside the semiconductor device and a voltage difference $\Psi_{dd}$ across a prescribed segment dd along an internal segment IJ of the semiconductor device; (c) a calculation unit which calculates at least either one of the electron current density $J_{eIJ}$ and the hole current density $J_{hIJ}$ along the segment IJ connecting given points I and J inside the semiconductor device; (d) a evaluation unit which evaluates the behavior of the above-mentioned semiconductor device based on the above-mentioned electron current density $J_{eIJ}$ and the hole current density $J_{hIJ}$; and (e) an output unit which outputs a terminal current and also the device behavior results. Out of these components, the calculation unit may be composed of a processor or the operational circuit in a central processing unit (CPU) so as to perform the above-mentioned Equations (29) through (31) using the constant $C_{eI}$ related to the point I, the constant $C_{eJ}$ related to the point J, the voltage difference ($\Phi_{edd}=\Psi_{dd}/NV_e$) across the segment dd normalized by the electron's thermal voltage ($NV_e=k\cdot T_e/(-q)$), the constant $C_{hI}$ related to the point I, the constant $C_{hJ}$ related to the point J, and the voltage difference ($\Phi_{hdd}=\Psi_{dd}/NV_h$) across the segment dd normalized by the hole's thermal voltage ($NV_h=k\cdot T_h/q$). Out of these factors, the constants $C_{eI}$ and $C_{hI}$ related to the point I and the constants $C_{eJ}$ and $C_{hJ}$ related to the point J are defined by the above-mentioned first feature of the present invention. Also, "the voltage difference $\Psi_{dd}$ across a prescribed segment dd along an internal segment of a semiconductor device" may be, like in the case of the first feature, the voltage difference ($\Psi_{IJ}=\Psi_I-\Psi_J$) across the segment IJ and also may be a voltage difference $\Psi_e^{\lambda}$ across an electron mean free path $\lambda_e$ as against the electron current density $J_{eIJ}$ and the voltage difference $\Psi_h^{\lambda}$ across a hole mean free path $\lambda_h$ as against the hole current density $J_{hIJ}$.

If a target semiconductor device is a simple diode, it may be necessary only to calculate either the electron current density $J_{eIJ}$ or the hole current density $J_{hIJ}$. If the target semiconductor device is a thyrister, a CMOS IC, or a more complicated integrated circuit, however, it is necessary to calculate both the electron current density $J_{eIJ}$ and the hole current density $J_{hIJ}$. Therefore, a selection circuit may be provided which selects and calculates either the electron current density $J_{eIJ}$ or the hole current density $J_{hIJ}$ as required, depending on the performance and the design specifications of the target semiconductor device. The input unit may be a keyboard, a mouse, a light-pen, a flexible disk unit, etc., while the output unit may be a display or a printer. Also, the obtaining unit, the calculation unit, and the evaluation unit may be a central processing unit (CPU) which executes various kinds of processing in an ordinary computer system.

According to the second feature of the present invention, it is possible to realize a device simulator that can rapidly and stably obtain the behavior of a semiconductor device, which satisfies prescribed specifications and accuracy by operating the relevant parameters even if they contain numeric errors. With this, the period required for designing LSIs or other various semiconductor devices can be shortened, thus reducing the time required for fabricating semiconductor devices employing the device simulation results.

As for the second feature of the present invention, another calculation unit (a second calculation unit) which calculates the electron energy flux density $S_{eIJ}$ and the hole energy flux density $S_{hIJ}$ can further be added to perform Equations (67) through (72) described later. By thus adding the second calculation unit which calculates the electron and hole energy flux densities $S_{eIJ}$ and $S_{hIJ}$, to obtain the solutions of the basic equations to which the electron energy flux continuity equation and the hole energy flux continuity equation are added, a novel device simulator can be provided which rapidly and accurately simulates LSIs having finer and finer geometries, hot-electron devices, and other high electric field devices etc.

The third feature of the present invention is a semiconductor device simulation method which comprises at least the steps of (a) inputting a geometry of a semiconductor device, a donor impurity concentration and an acceptor impurity concentration at each point inside a semiconductor device and its terminal voltages; (b) setting initial values by obtaining an electron concentration and a hole concentration and also a potential at each point inside the semiconductor device; (c) obtaining a voltage difference $\Psi_{dd}$ across a prescribed segment dd along an internal segment IJ of the semiconductor device; (d) calculating by use of the above-mentioned equations (29) through (31) the electron current density $J_{eIJ}$ along the segment IJ connecting points I and J using a constant $C_{eI}$ related to the point I, a constant $C_{eJ}$ related to the point J, and a voltage difference ($\Phi_{edd}=\Psi_{dd}/NV_e$) across the segment dd normalized by and the electron's thermal voltage ($NV_e=k\cdot T_e/(-q)$); (e) calculating by use of the above-mentioned equations (30) and (31) the hole current density $J_{hIJ}$ along the segment IJ connecting the points I and J using a constant $C_{hI}$ related to the point I, a constant $C_{hJ}$ related to the point J, and a voltage difference ($\Phi_{hdd}=\Psi_{dd}/NV_h$) across the segment dd normalized by the hole's thermal voltage ($NV_h=k\cdot T_h/q$); and (f) outputting a terminal current. Here, the constants $C_{eI}$ and $C_{hI}$ related to the point I and the constants $C_{eJ}$ and $C_{hJ}$ related to the point J are defined by the above-mentioned first feature of the present invention. Also, "the voltage difference $\Psi_{dd}$ across a prescribed segment dd along an internal segment IJ of a semiconductor device" means the voltage difference defined the same way as in the case of the first feature.

In the third feature of the present invention, either the step of calculating the electron current density $J_{eIJ}$ or the step of calculating the hole current density $J_{hIJ}$ can be performed earlier than the other. Also, depending on the performance or the design specifications of a target semiconductor device, either the electron current density $J_{eIJ}$ or the hole current density $J_{hIJ}$ may be so small as to be negligible against the other. Therefore, in the designing of some semiconductor devices, either one of the step of calculating the electron current density $J_{eIJ}$ and the step of calculating the hole current density $J_{hIJ}$ may be omitted.

According to the third feature of the present invention, solutions of the basic equations can always be obtained even in such a situation that numeric errors may occur in the electron mobility $\mu_e$ or the hole mobility $\mu_h$ in a semiconductor in a stronger electric field region. Also, such a semiconductor device simulation method can be provided that various numeric errors, if any in the numeric calculations by use of an actual computer, have no considerable effects on the calculation results. Thus, by rapidly and stably evaluating the behavior of a semiconductor device that satisfies a prescribed accuracy, the design period can be reduced. As a result, faults of the semiconductor device because of mistakes in design can be prevented beforehand, thus reducing the period of fabricating complicated semiconductor devices.

Also, as for the third feature of the present invention, a step of calculating the electron energy flux density $S_{eIJ}$ and the hole energy flux density $S_{hIJ}$ by use of Equations (67) through (72) can be further added to the existing steps. By calculating the electron and hole energy flux densities $S_{eIJ}$ and $S_{hIJ}$, fine-patterned LSIs, hot-electron devices, etc. can be simulated rapidly and accurately.

The fourth feature of the present invention is a storage medium which stores a program that performs the above-mentioned device simulation methods by operating the above-mentioned device simulators. That is, the storage medium capable of mechanical read-out—which records therein the device simulation programs—actually stores a program comprising the steps of (a) inputting a geometry of a semiconductor, a donor impurity concentration and an acceptor impurity concentration at each point in the semiconductor device, and its terminal voltages; (b) setting initial values by obtaining an electron concentration, a hole concentration, and a voltage at each point in the semiconductor device; (c) obtaining a voltage difference $\Psi_{dd}$ across a prescribed segment dd along an internal segment IJ of the semiconductor device; (d) calculating by use of the above-mentioned equations (29) and (31) the electron current density $J_{eIJ}$ along the segment IJ connecting points I and J using a constant $C_{eI}$ related to the point I, a constant $C_{eJ}$ related to the point J, and a voltage difference ($\Phi_{edd}=\Psi_{dd}/NV_e$) across the segment dd normalized by the electron's thermal voltage ($NV_e=k\cdot T_e/(-q)$); (e) calculating by use of the above-mentioned equations (30) and (31) the hole current density JhJ along the segment IJ connecting the points I and J using a constant $C_{hI}$ related to the point I, a constant $C_{hJ}$ related to the point J, and a voltage difference ($\Phi_{hdd}=\Psi_{dd}/NV_h$) normalized by the hole's thermal voltage ($NV_h=k\cdot T_h/q$); and (f) outputting a terminal current. The storage medium here may be such a semiconductor memory as RAM or ROM, a magnetic disk, an optical disk, a magneto-optical disk, a magnetic tape, or other medium which can store the program of the present invention. Also, the constants $C_{eI}$ and $C_{hI}$ related to the point I and the constants $C_{eJ}$ and $C_{hJ}$ related to the point J are defined by the above-mentioned first feature of the present invention. Further, "the voltage difference $\Psi_{dd}$ across a prescribed segment dd along an internal segment IJ of a semiconductor device" is the value defined the same way as in the case of the first feature.

By executing the program stored in the storage medium related to the fourth feature of the present invention, solutions of the basic equations can be always obtained even in such a situation that numeric errors may occur in the electron mobility $\mu_e$ or the hole mobility $\mu_h$ in a strong electric field region. Also, even if various numeric errors may occur in the numerical calculations by a computer which reads in the program, such a device simulation method can be provided that the numeric errors have no significant effects on the calculation results. Therefore, the behavior of a semiconductor device which satisfies a prescribed accuracy can be evaluated rapidly, thus reducing the period of design. As a result, faults of the semiconductor device because of mistakes in design can be prevented beforehand, thereby reducing the period of fabricating complicated semiconductor devices.

Also, as for the fourth feature of the present invention, the program to which a step of calculating the electron and hole energy flux densities $S_{eIJ}$ and $S_{hIJ}$ given by Equations (67) through (72) described later is further added may be stored in the storage medium of the present invention. By executing such a program to calculate the electron and hole energy flux densities $S_{eIJ}$ and $S_{hIJ}$, miniaturized LSIs, hot-electron devices, etc., can be simulated rapidly and accurately.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1:
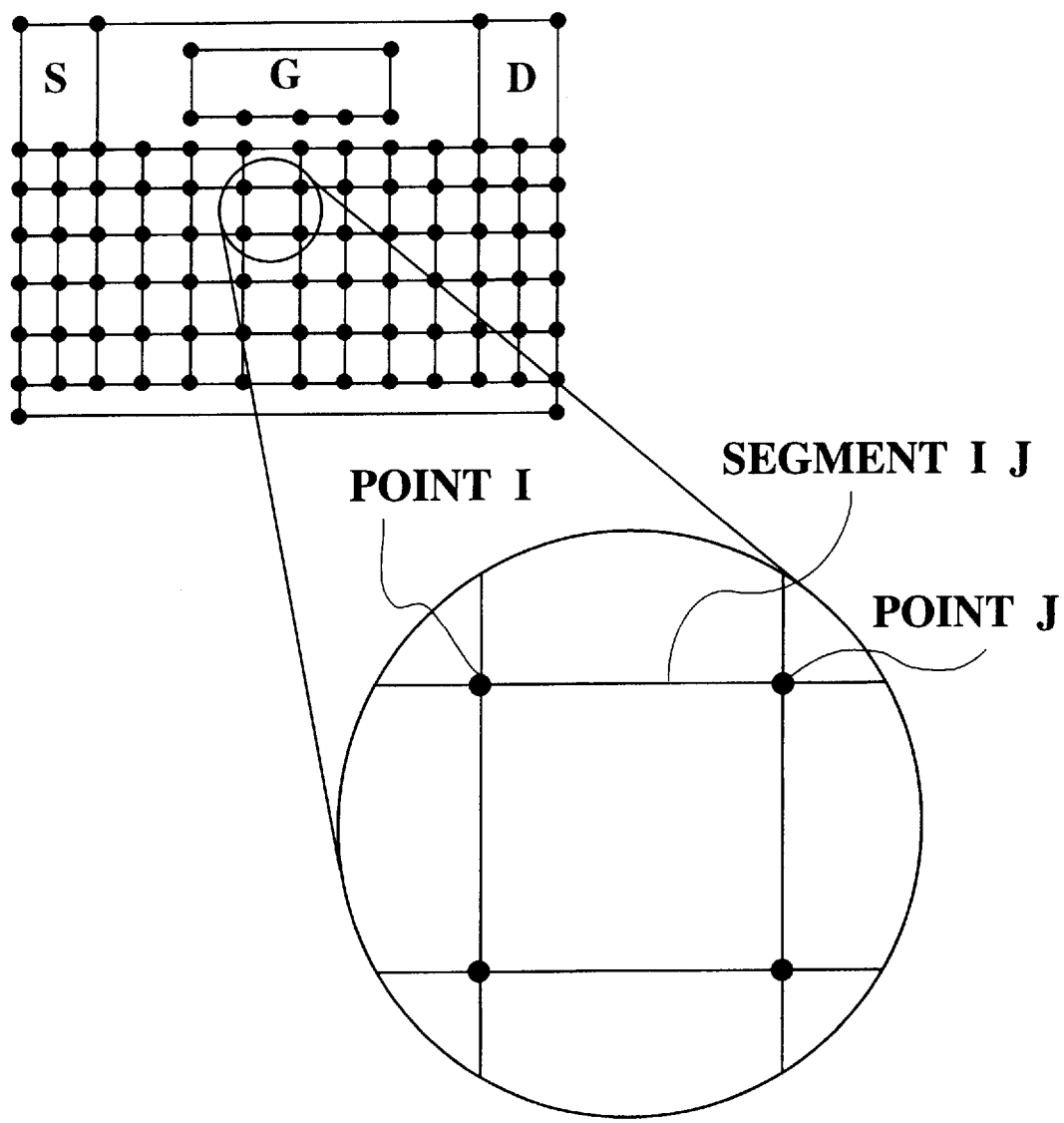
FIG. 1 shows the geometry of a semiconductor device as expressed in an aggregate of polygons.
Figure 2:
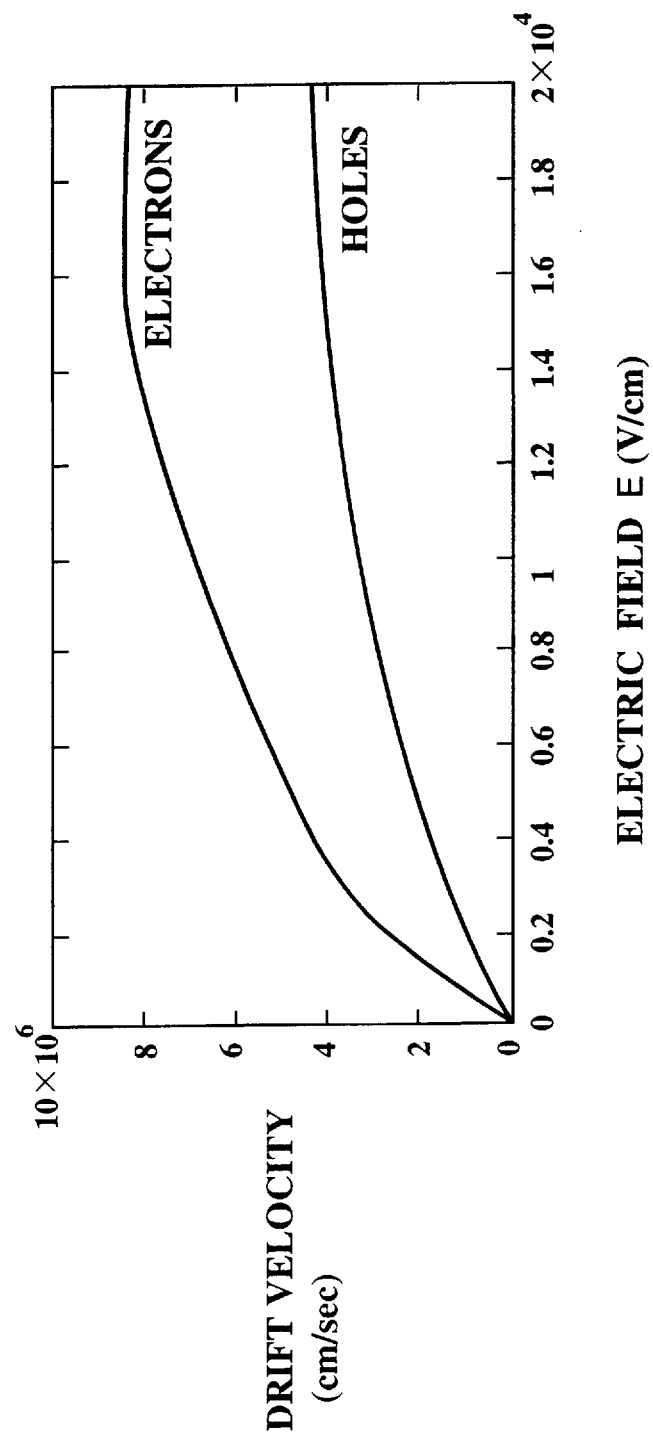
FIG. 2 is a graph showing the dependency of electron and hole drift velocities in silicon upon electric fields.
Figure 3A:
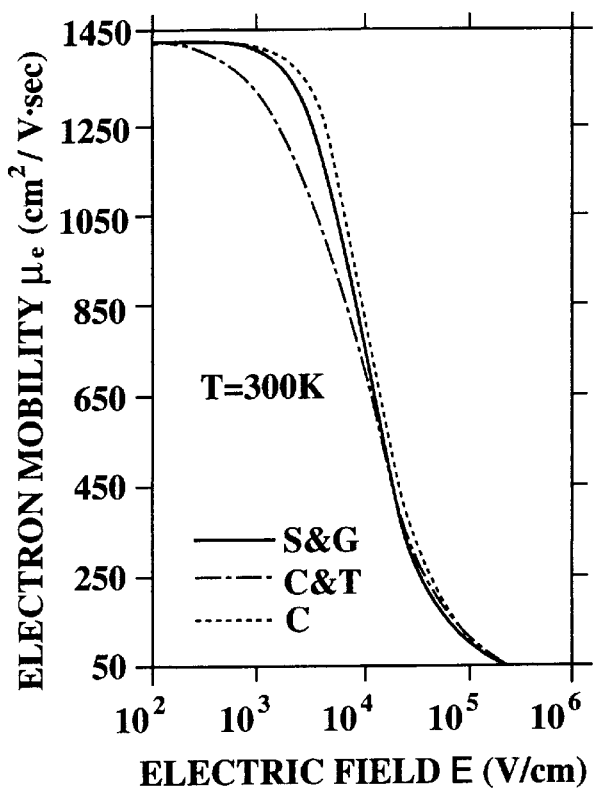
FIG. 3A is a graph showing the dependency of electron mobilities in silicon upon electric fields.
Figure 3B:
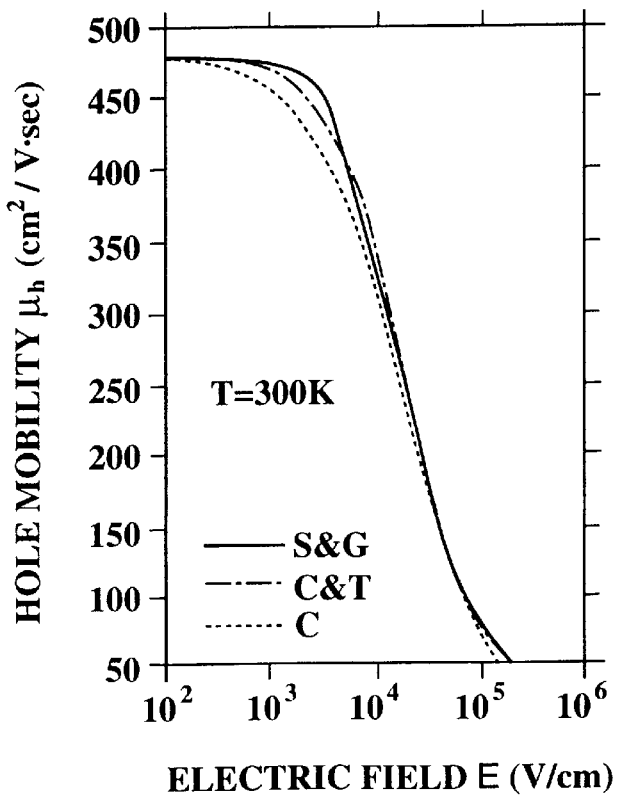
FIG. 3B is a graph showing the dependency of hole mobilities in silicon upon electric field.

Various embodiments of the present invention will be disclosed with reference to the accompanying drawings. It is to be noted that the same or similar reference numerals are applied to the same or similar parts and elements throughout the drawings, and the description of the same or similar parts and elements will be omitted or simplified.

First, the following will describe a semiconductor-device simulator of the present invention and a storage medium capable of mechanical read-out which stores the program simulating and evaluating the behavior of the semiconductor device and then the semiconductor-device simulation methods over four embodiments. Finally, the method of fabricating the semiconductor device of the present invention is described.

(DEVICE SIMULATOR AND STORAGE MEDIUM STORING PROGRAM)

Figure 4:
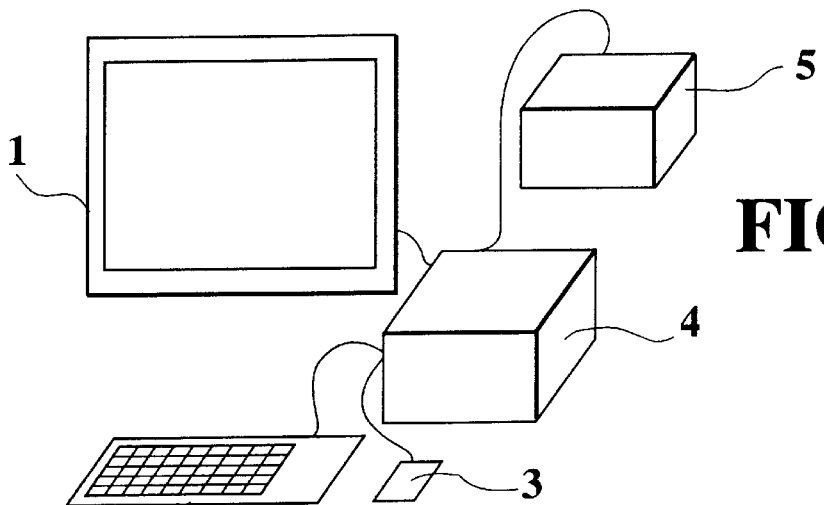
FIG. 4 outlines a system configuration of a device simulator used in the first to fourth embodiments of the present invention.

FIG. 4 shows a device simulator for semiconductor devices of the present invention. The device simulator shown in FIG.4 employs a known Neumann-type computer. This semiconductor device simulator uses an ordinary computer system that comprises a central processing unit (CPU) 4 which executes various processing, and input unit such as a keyboard 2, a mouse 3, a light-pen (not shown), or a flexible disk unit (not shown), a memory unit 5 such as a semiconductor memory unit having ROMs and RAMs or a disk unit, and an output unit 1 such as a display or a printer.

The memory unit 5 here has FORTRAN77 compiler installed therein. A programmer of the device simulator writes the program for the semiconductor-device simulation methods described over the following first through the fourth embodiments in the FORTRAN77 language and creates a program file (source file) and then stores it in the memory unit 5 such as the disk unit. This program file is compiled into a machine language with FORTRAN77 compiler, to create an execution file capable of read-out in a machine language that is executed in a computer system of this device simulator. When this execution file is executed by the CPU 4, various semiconductor devices can be simulated. The CPU 4 may contain an obtaining unit, a calculation unit, and a evaluation unit so as to perform the above-mentioned Equations (29) through (31). The obtaining unit obtains an electron concentration and a hole concentration at each point inside the semiconductor device and a voltage difference. The calculation unit calculates at least either one of the electron current density and the hole current density, and the evaluation unit evaluates the behavior of the above-mentioned semiconductor device based on the above-mentioned electron and hole current densities. Further the CPU 4 may contain another calculation unit(a second calculation unit) which can calculate an electron energy flux density and a hole energy flux by performing Equations (67) through (72) described later. Before this device simulation is actually performed, various variables described in the following embodiments are stored in a storage medium and then, from the storage medium, are read out as required by the CPU 4 for data processing. The input units such as the keyboard 2 and the mouse 3 input a geometry of a semiconductor device, a donor impurity concentration and an acceptor impurity concentration at each point inside the objective semiconductor device, and terminal voltages of the semiconductor device. The output unit 1 outputs a terminal current and also the device behavior results.

Also, the program for realizing semiconductor-device simulation methods described in the following first through fourth embodiments can be stored in the storage medium. The contents of this storage medium can be read by the computer system, which then executes that program, to control the computer so as to realize a desired semiconductor-device simulation method. The storage medium here includes a semiconductor memory, a magnetic disk, an optical disk, a magneto-optical disk, a magnetic tape, and other media capable of storing the program of the present invention.

FIRST EMBODIMENT

Figure 5:
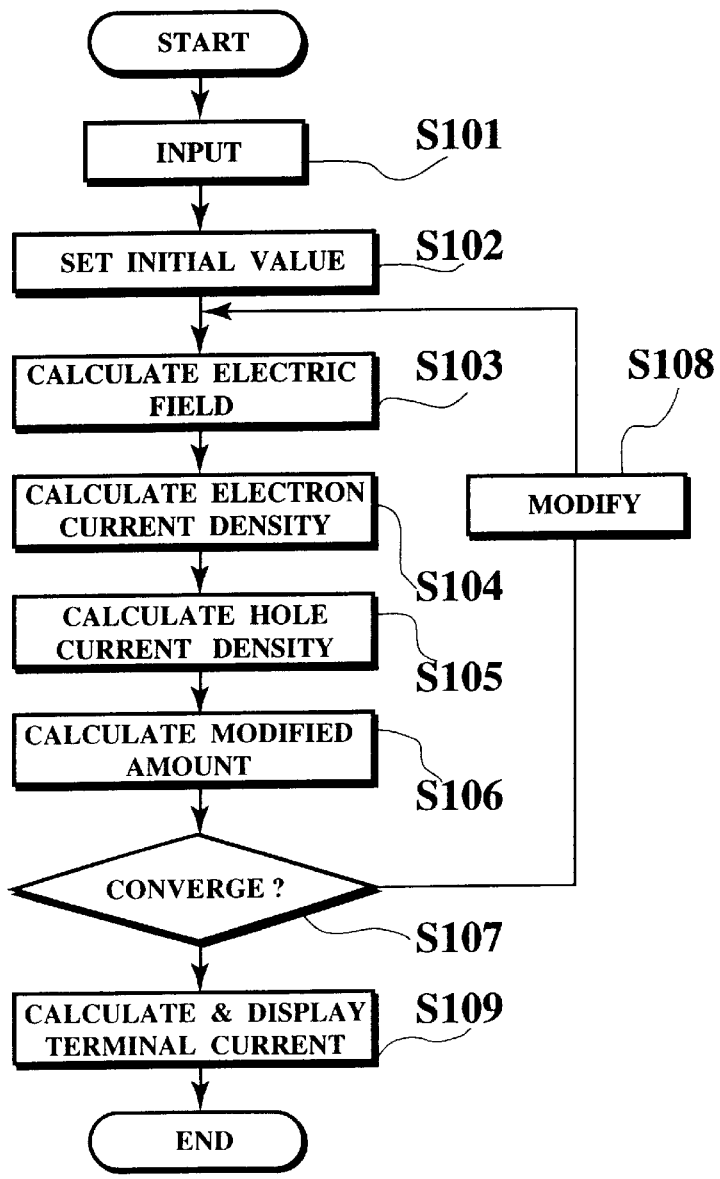
FIG. 5 is a flowchart of processing by a semiconductor-device simulation method related to the first through third embodiments of the present invention.

FIG. 5 is a flowchart of a procedure for a semiconductor-device simulation method related to the first embodiment of the present invention. The semiconductor-device simulation method related to the first embodiment of the present invention employs a voltage difference ($\Psi_{IJ}=\Psi_J-\Psi_I$) across a segment IJ as the "voltage difference $\Psi_{dd}$ across a prescribed segment dd along the internal segment IJ of a semiconductor." When activated, the program first performs input step S101. At input step S101, first the program inputs the geometry of a semiconductor device. This geometry has been calculated by a known process simulator. At the same time, a donor impurity concentration $N_D$ and an acceptor impurity concentration $N_A$ calculated by the process simulator for each point of the semiconductor are also input. Alternately, the mouse 3 may be used to input the geometry. In this case, the user uses a known figure edit software. To represent the donor impurity concentration $N_D$ and the acceptor impurity concentration $N_A$, the Gaussian distribution function and the complementary error function are overlapped and their function parameters are input from the keyboard 2. Terminal voltages applied to electrode regions such as source, drain and gate regions are also input from the keyboard 2.

Subsequently, the geometry of the semiconductor device is subdivided into a number of polygons. The subdivision is actually carried out based on the following two criteria.

(A) The segment shall not exceed 0.1 micrometer in length.
(B) The ratio of an impurity concentration between both ends of a segment shall not exceed 10.

If there are any polygons which do not satisfy the condition (A) or (B), the relevant polygons are subdivided automatically until both conditions (A) and (B) are satisfied.

Next, the program performs step S102 for setting initial values. At this step, the program actually sets a potential $\Psi$, an electron concentration n, and a hole concentration p for each vertex.

In the embodiments of the present invention, the program performs the step according to the following procedure.

(a) Set, to each potential $\Psi$ of respective vertexes in contact with the polygon of each electrode, the specific voltages applied to the electrodes, respectively.
(b) For vertexes at which the donor impurity concentration $N_D$ is not less than the acceptor impurity concentration $N_A$ out of those vertexes in contact with polygons in the semiconductor device, set the value of $N_D$ to a variable "N" corresponding to the electron concentration n and the value of $n_i^2/N_D$ to a variable "p" corresponding to the hole concentration p. In this case, the value of, for example, the intrinsic carrier concentration $n_i=10^{10}$ cm$^{-3}$ is used.
(c) For vertexes at which $N_A$ is larger than $N_D$ out of those vertexes in contact with polygons in the semiconductor device, set the value of $N_A$ to "p" and the value of $n_i^2/N_A$ to "N".
(d) For the vertexes to which $\Psi$ is not set yet, set 0 to "$\Psi$".
(e) For the vertexes at which neither "N" nor "p" is set yet, set 0 to "N" and "p". In this case, "$\Psi$", "N", and "p" are stored in the respective real-number variables having the vertex number as an index.

Next, the program performs step S103 for calculating the electric field. At this step, the program actually calculates the electric field using Equation (1) for each segment of the polygon. Thus calculated electric field is stored in a real-number variable array having the segment number as an index.

Next, the program performs step S104 for calculating the electron current density. At this step, the program actually calculates the electron current density $J_{eIJ}$ using the above-mentioned equations (29) and (31) for each side (segment) of the polygon. Specifically, suppose the following equations to be true.

$$C_{eI} = -q \cdot F_{eI} \cdot n_I \tag{32}$$

$$C_{eJ} = -q \cdot F_{eJ} \cdot n_J \tag{33}$$

$$F_{eI} = F_{eJ} = F_{eIJ} \tag{34}$$

Then, the above-mentioned equation (29) can be expressed by the following equation $$J_{eIJ} = -q \cdot F_{eIJ} \cdot (A(\Psi_{IJ}/NV_e) \cdot n_I - A(-\Psi_{IJ}/NV_e) \cdot n_J) \tag{35}$$

Also, assume that the proportional coefficient $F_{eIJ}$ of the electron current density $J_{eIJ}$ is defined by a bounded function at the following condition $$|\Psi_{IJ}| \to \infty \tag{36}$$

Then, the proportional coefficient $F_{eIJ}$ is calculated by the following equation (37). That is, Equation (37) is used in calculation using the length $d_{IJ}$ of a segment IJ and the low field electron mobility $\mu_{eWIJ}$ along the segment IJ.

$$F_{eIJ} = 2 \cdot (\mu_{eWIJ}/d_{IJ}) \cdot NV_e \tag{37}$$

Also, the low field electron mobility $\mu_{eWIJ}$ given in Equation (37) can be calculated by a known method (Konishi, et al. IEICE of Japan, Tech. Reports (Singaku-gihou), SDM92-93, (1992): hereinafter called "the Konishi's method"). Thus calculated electron current density $J_{eIJ}$ is stored in a real-number variable array having the side (segment) number as an index.

Next, the program performs step S105 for calculating the hole current density $J_{hIJ}$. At this step, the program actually calculates the hole current density for each segment of the polygon using the above-mentioned equations (30) and (31). More specifically, assume the following equations to be true.

$$C_{hI}=q \cdot F_{hI} \cdot p_I \tag{38}$$

$$C_{hJ}=q \cdot F_{hJ} \cdot p_J \tag{39}$$

$$F_{hI}=F_{hJ}=F_{hIJ} \tag{40}$$

Then, the above-mentioned equation (30) can be expressed as follows.

$$J_{hIJ}=q \cdot F_{hIJ} \cdot (A(\Psi_{IJ}/NV_h) \cdot p_I - A(-\Psi_{IJ}/NV_h) \cdot p_J) \tag{41}$$

Equation (41) uses the following equation (42) to calculates $F_{hIJ}$, i.e., the proportional coefficient of the hole current density $J_{hIJ}$ defined by a bounded function prescribed at the condition shown in Equation (36), using the length $d_{IJ}$ of the segment IJ and the low field hole mobility $\mu_{hwIJ}$ along the segment IJ.

$$F_{hIJ}=2 \cdot (\mu_{hwIJ}/d_{IJ}) \cdot NV_h \tag{42}$$

The low field hole mobility $\mu$hwIJcan be calculated by the Konishi's method. Thus calculated hole current density $J_{hIJ}$ is stored in a real-number variable array having the segment number as an index.

Next, the program performs step S106 for calculating modified amounts. At this step, modified amounts $\Delta\Psi_I$, $\Delta\Psi_J$, $\Delta n_I$, $\Delta n_J$, $\Delta p_I$, and $\Delta p_J$ of $\Psi_I$, $\Psi_J$, $n_I$, $n_J$, $p_I$, and $p_J$ of each vertex are calculated respectively by the known method (see the Selberherr's method).

Next, the program perform step S107 for deciding convergence. At this step, the program decides convergence when the following three conditions are all satisfied and then goes to step S109. Otherwise, the program goes to step S108.

(1) The maximum absolute values of calculated amounts for each vertex $\Delta\Psi_I/NV_e$, $\Delta\Psi_J/NV_e$, $\Delta\Psi_I/NV_h$, and $\Delta\Psi_J/NV_h$ are not more than 0.01.
(2) The maximum absolute values of calculated amounts for each vertex $\Delta n_I/n_I$ and $\Delta n_J/n_J$ are not more than 0.01.
(3) The maximum absolute values of calculated amounts for each vertex $\Delta p_I/p_I$ and $\Delta p_J/p_J$ are not more than 0.01.

When it has gone to step S109 based on the results of the above-mentioned convergence decision step S107, the program calculates terminal currents and performs step S109 for display and then puts an end to its processing. The program thus calculates terminal currents for each electrode at step S109. The terminal current is actually calculated by multiplying a current density by the surface area of the electrode. The values of thus calculated terminal currents are displayed on the screen in the order of electrode number.

If, on the other hand, it has gone to step S108 based on the results of the above-mentioned convergence decision step S107, the program performs step S108 and then returns to step S103 for calculating the electric field. At step S108 for modification, the program adds modified amounts $\Delta\Psi_I$, $\Delta\Psi_J$, $\Delta n_I$, $\Delta n_J$, $\Delta p_I$, and $\Delta p_J$ to $\Psi_I$, $\Psi_J$, $n_I$, $n_J$, $p_I$, and $p_J$ for each vertex respectively.

Figure 6:
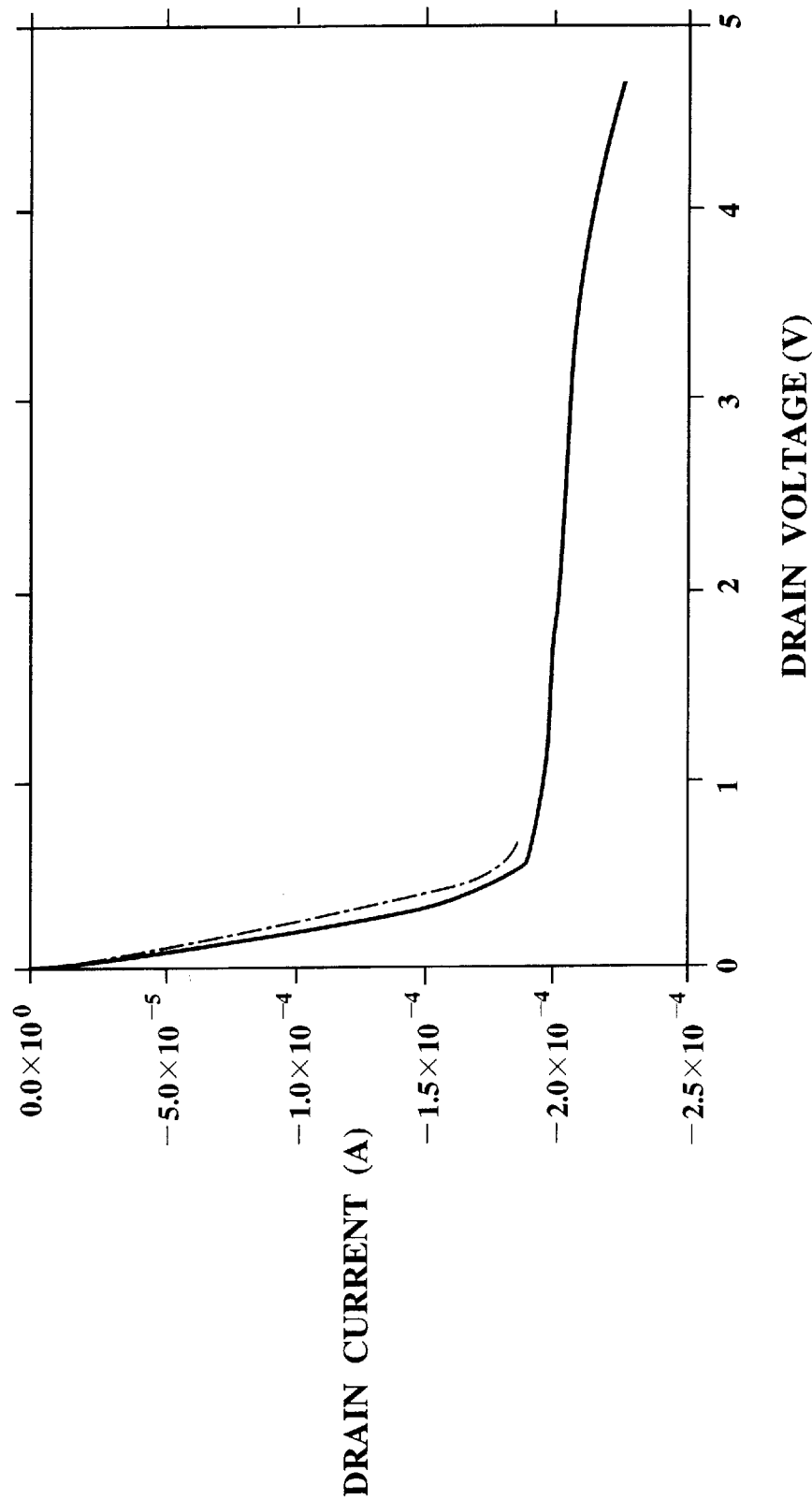
FIG. 6 is a graph showing the results of the semiconductor device simulations by the first embodiment of the present invention and the prior art.

FIG. 6 is a graph showing the characteristics of a semiconductor device (MOSFET) which are calculated in the first embodiment of the present invention. In FIG. 6, the solid line represents the characteristics of the MOSFET obtained by the first embodiment of the present invention. The dash-and-dot line, on the other hand, represents the characteristics of the MOSFET obtained by the prior art, by which the drain current is obtained for a limited range of the drain voltage. According to the first embodiment of the present invention, solutions could be obtained for larger drain voltage ranges. According to the prior art, on the other hand, no solutions could be obtained because of numeric errors when the drain voltage exceeds a certain value.

Also, the prior art is different from the first embodiment of the present invention in that it performs step S104 for calculation of the electron current density $J_{eIJ}$ in FIG. 5 by using Equation (2) and step S105 for calculation of the hole current density $J_{hIJ}$ in FIG. 5 by using Equation (3) and also that it calculates the electron mobility $\mu_{eIJ}$ and the hole mobility $\mu_{hIJ}$ along each segment IJ by using the Konishi's method.

As mentioned above, a semiconductor-device simulation method related to the first embodiment of the present invention makes it possible to rapidly and stably obtain the device behavior that cannot be obtained by the prior art because of numeric errors. Moreover, such an expansion of terminal voltage range (drain voltage range) of semiconductor-device simulation is no less than improvements in the accuracy of a device simulator. The improvements in accuracy can shorten the design period and therefore the period of fabricating semiconductor devices.

SECOND EMBODIMENT

Now, the following will describe a semiconductor-device simulation method related to the second embodiment of the present invention with reference to the accompanying drawings. This method executes its processing according to the flowchart explained about the above-mentioned first embodiment. In the second embodiment, at step S104 for calculating the electron current density $J_{eIJ}$, the program calculates a function A defined by Equation (31). In this processing, the length $d_{IJ}$ of a segment IJ is calculated using the electron mean free path $\lambda_e$ along the segment IJ as follows.

$$d_{IJ}=\lambda_e \tag{43}$$

At step S104 then, the program calculates the proportional coefficients $F_{eI}$ and $F_{eJ}$ defined by a bounded function prescribed at the condition of Equation (36) employing the electron's saturated drift velocities $v_{esatI}$ and $v_{esatJ}$ at the points I and J respectively as follows.

$$F_{eI}=v_{esatI} \tag{44}$$

$$F_{eJ}=v_{esatJ} \tag{45}$$

Further, the program uses the function A defined by Equation (31), to calculate the electron current density $J_{eIJ}$.

Also, in the processing at step S105 for calculating the hole current density, the program calculates the function A defined by Equation (31) and then also the proportional coefficients $F_{hI}$ and $F_{hJ}$ defined by the bounded function prescribed by the Equation (36), employing the hole's saturated drift velocities $v_{hsatI}$ and $v_{hsatJ}$ respectively with the following equations.

$$F_{hI}=v_{hsatI} \tag{46}$$

$$F_{hJ}=v_{hsatJ} \tag{47}$$

By using these equations, the electron current density $J_{eIJ}$ and the hole current density $J_{hIJ}$ can be calculated further accurately, thus improving the accuracy of the device simulator.

Figure 7:
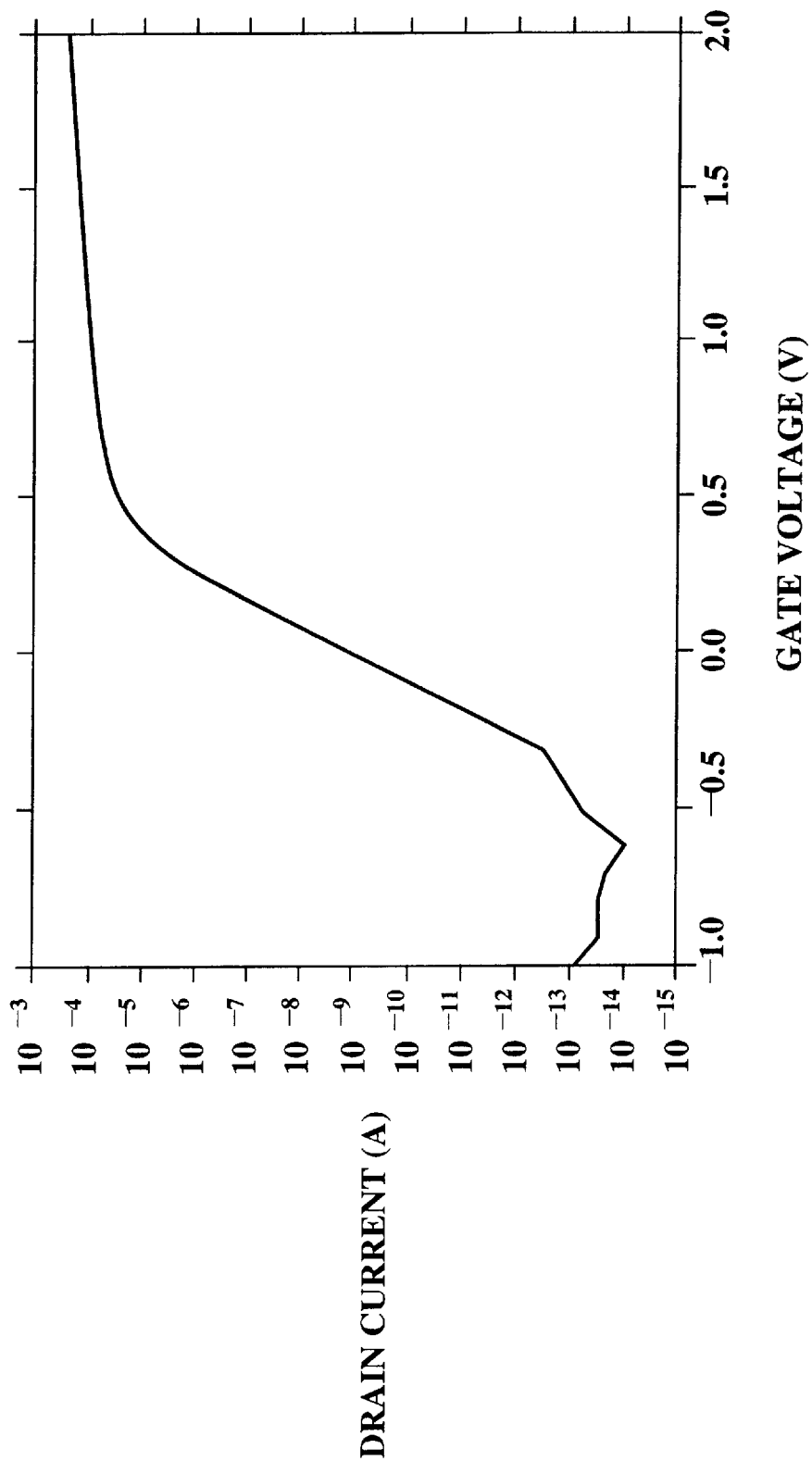
FIG. 7 is a graph showing the results of the semiconductor device simulation by the second embodiment of the present invention.

The other steps are omitted in description because it is almost the same as that for the above-mentioned first embodiment. FIG. 7 is a graph showing the characteristics of a semiconductor device (MOSFET) which are calculated by the method in the second embodiment of the present invention. In FIG. 7, the horizontal axis represents the required gate voltage (V) and the vertical axis, the drain current (A). In the second embodiment, all the values of the required gate voltage represented by the horizontal axis can have the corresponding values of drain current as shown in FIG. 7, whereas by the prior art, no solutions can be given to any application voltage.

In the second embodiment of the present invention, the length $d_{IJ}$ of a segment IJ is calculated by Equation (43) based on the electron mean free path $\lambda_e$ along the segment IJ, so that there are large errors for holes. With this, therefore, although somewhat complicated, the length $d_{eIJ}$ of the segment IJ for electrons and the length $d_{hIJ}$ of the segment IJ for holes may be defined independently of each other. That is, the length $d_{eIJ}$ of the segment for electrons and the length $d_{hIJ}$ of the segment IJ for holes may be calculated using the following equations (48a) and (48b) based on the electron mean free path $\lambda_e$ and the hole mean free path $\lambda_h$, to calculate the electron current density $J_{eIJ}$ and the hole current density $J_{hIJ}$ respectively.

$$d_{eIJ} = \lambda_e \tag{48a}$$

$$d_{hIJ} = \lambda_h \tag{48b}$$

In the case that the values of $d_{eIJ}$ and $d_{hIJ}$ are defined independently to each other, the vertexes of polygons for electrons and holes cannot coincident with each other, so that the values of both electrons and holes cannot be obtained at the same point. In this case, however, values in deficiency can be obtained by interpolation from the value of ambient vertexes.

THIRD EMBODIMENT

Now, the following describes semiconductor-device simulation methods related to the third embodiment of the present invention with reference to the accompanying drawings. Those simulation methods of the third embodiment are the same as those of the first embodiment in executing processing according to the flowchart described in the first embodiment, except that as "the voltage difference $\Psi_{dd}$ across the prescribed segment dd along the internal segment IJ of a semiconductor," a voltage difference $\Psi^\lambda_e$ across the electron mean free path $\lambda_e$ is used for the electron current density $J_{eIJ}$ and a voltage difference $\Psi^\lambda_h$ across the hole mean free path $\lambda_h$ is used for the hole current density $J_{hIJ}$.

In the third embodiment, before the geometry of a semiconductor device is subdivided into a number of polygons, the following criteria are used.

Criteria: The length of each segment shall not exceed 0.05 micrometer.

Polygons created according to the above criteria are hereinafter called "polygon A." Besides, "polygon B" is created by bisecting each segment of polygons A. By evaluating the device behaviors using polygons A and those using polygons B respectively, the evaluation results of both cases are compared to each other.

If $\Psi_{dd} = \Psi^\lambda_e = -\lambda_e \cdot E_{IJ}$ is assumed using the electron mean free path $\lambda_e$ in the processing at step S104 for calculating the electron current density $J_{eIJ}$ in the third embodiment, the above-mentioned equation (29) is expressed by the following equation (49) based on similar relationships among Equations (32), (33), and (34).

$$J_{eIJ}' = -q \cdot F_{eIJ}' \cdot (A(-\lambda_e \cdot E_{IJ}/NV_e) \cdot n_I' - A(\lambda_e \cdot E_{IJ}/NV_e) \cdot n_J') \tag{49}$$

where $F_{eIJ}'$ is an electron's saturated drift velocity $v_{esatBe}$ at a point $B_e$ along the segment IJ($F_{eIJ}' = v_{esatBe}$), $n_I'$ is an electron concentration at a point I' distant from the point $B_e$ along the segment IJ by $\lambda_e/2$ in the direction of a point I, and $n_J'$ is an electron concentration at point J' distant from the above-mentioned point $B_e$ by $\lambda_e/2$ in the direction of a point J. Here, the electron mean free path $\lambda_e$ is calculated by the following equation (50) using an electron's saturated drift velocity $v_{esat}$ and a low field electron's mobility $\mu_{ewIJ}$.

$$\lambda_e = 2 \cdot \mu_{ewIJ} \cdot NV_e / v_{esat} \tag{50}$$

Also, if $\Psi_{dd} = \Psi^\lambda_h = -\lambda_h \cdot E_{IJ}$ is assumed using the hole mean free path $\lambda_h$ in the processing at step S105 for calculating the hole current density $J_{hIJ}$, the above-mentioned equation (30) can be expressed by the following equation (51) based on similar relationships among Equations (38), (39), and (40).

$$J_{hIJ} = q \cdot F_{hIJ}' \cdot (A(-\lambda_h \cdot E_{IJ}/NV_h) \cdot p_I' - A(\lambda_h \cdot E_{IJ}/NV_{vh}) \cdot p_J') \tag{51}$$

where $F_{hIJ}'$ is a hole's saturated drift velocity $v_{hsatBh}$ at a point $B_h$ along the segment IJ($F_{hIJ}' = v_{hsatBh}$), $p'$ is a hole concentration at a point I' distant from the point $B_h$ along the segment IJ by $\lambda_h/2$ in the direction of the point I, and $p_J'$ is a hole concentration at a point J' distant from the above-mentioned point $B_h$ by $\lambda_h/2$ in the direction of the point J. Here, the hole mean free path $\lambda_h$ is calculated by the following equation (52) using a hole's saturated drift velocity $v_{hsat}$ and a low field hole mobility $\mu_{hwIJ}$.

$$\lambda_h = 2 \cdot \mu_{hwIJ} \cdot NV_h / v_{hsat} \tag{52}$$

Also, the points $B_e$ and $B_h$ are assumed to be at the center of their respective segments. If, also, $d_{IJ}$ is larger than $\lambda_e$, $n_I'$ and $n_J'$ are obtained based on the electron concentrations $n_I$ and $n_J$ at the points I and J by a known interpolation method respectively. If $d_{IJ}$ is smaller than $\lambda_e$, on the other hand, they are obtained based on $n_I$ and $n_J$ by a known extrapolation method. If $d_{IJ}$ is larger than $\lambda_h$, $p_I'$ and $p_J'$ are obtained based on the hole concentrations $p_I$ and $p_J$ at the points I and J by the known interpolation method respectively. If $d_{IJ}$ is smaller than $\lambda_h$, on the other hand, they are obtained based on $p_I$ and $p_J$ by the known extrapolation method. In the third embodiment, as indicated by Equation (49) or (51), a same value of the proportional coefficients $F_{eIJ}'$ and $F_{hIJ}'$ is used for the points I and J. However, those proportional coefficients may be different from each other as indicated in Equation (53) or (54) below.

$$J_{eIJ} = -q \cdot (F_{eI}' \cdot A(-\lambda_e \cdot E_{IJ}/NV_e) \cdot n_I' - F_{eJ}' \cdot A(\lambda_e \cdot E_{IJ}/NV_e) \cdot n_J') \tag{53}$$

$$J_{hIJ} = q \cdot (F_{hI}' \cdot A(-\lambda_h \cdot E_{IJ}/NV_h) \cdot p_I' - F_{hJ}' \cdot A(\lambda_h \cdot E_{IJ}/NV_h) \cdot p_J') \tag{54}$$

Also, $F_{eI}'$ may be calculated by the following equation (55) using an electron's saturated drift velocity $v_{esatI}$ at the point I'.

$$F_{eI}' = v_{esatI}' \tag{55}$$

$F_{eJ}'$ may be calculated by the following equation (56) using an electron's saturated drift velocity $v_{esatJ}'$ at the point J'.

$$F_{eJ}'=v_{esatJ}' \tag{56}$$

$F_{hI}'$ may be calculated by the following equation (57) using a hole's saturated drift velocity $v_{hsatI}'$ at the point I'.

$$F_{hI}'=v_{hsatI}' \tag{57}$$

$F_{hJ}'$ may be calculated by the following equation (58) using a hole's saturated drift velocity $v_{hsatJ}'$ at the point J'.

$$F_{hJ}'=v_{hsatJ}' \tag{58}$$

In these equations, $F_{eI}'$, $F_{eJ}'$, $F_{hI}'$, and $F_{hJ}'$ are proportional coefficients that are not always a constant.

Figure 8:
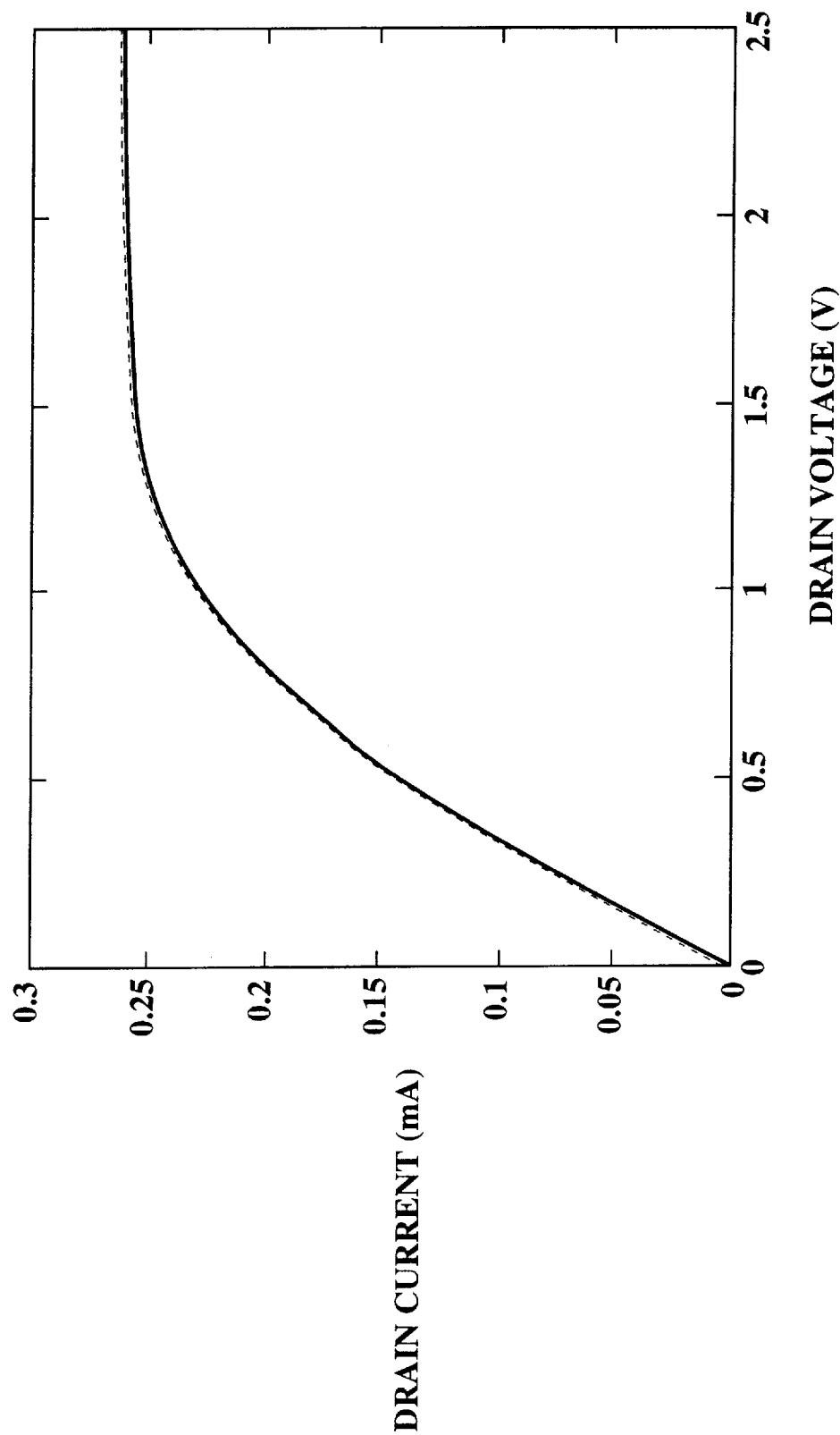
FIG. 8 is a graph showing the characteristics of a semiconductor device calculated by the third embodiment of the present invention.

The other processing steps are the same as in the case of the above-mentioned first embodiment and therefore omitted here. FIG. 8 is a graph showing the characteristics of a semiconductor device (MOSFET) which are calculated by the method in the third embodiment of the present invention. In this figure, the horizontal axis represents the drain voltage (V) and the vertical axis, the drain current (mA). The graph shows that the results of device simulation by use of the above-mentioned polygon A (solid line) and the those by use of the polygon B (dotted line) coincide with each other.

The third embodiment of the present invention, unlike the above-mentioned first embodiment, needs to use interpolation or extrapolation in order to calculate the above-mentioned $n_I'$, $n_J'$, $p_I'$, and $p_J'$, so that a larger amount of calculations must be performed, thus requiring much time for the device simulation. The third embodiment, however, can evaluate the device behavior with a high accuracy independently of the length of the segments of polygons, so that the design period can be decreased, thus reducing the fabrication period for semiconductor devices.

FOURTH EMBODIMENT

Now, the following will describe semiconductor-device simulation methods related to the fourth embodiment of the present invention. The semiconductor-device simulation method related to the fourth embodiment of the present invention will also use, as "the voltage difference $\Psi_{dd}$ across a prescribed segment dd along the internal segment IJ of a semiconductor" of the present invention, a voltage difference $\Psi^{\lambda}_e$ across an electron mean free path $\lambda_e$ as against an electron current density $J_{eIJ}$ and a voltage difference $\Psi^{\lambda}_h$ across a hole mean free path $\lambda_h$ as against a hole current density $J_{hIJ}$.

Figure 9:
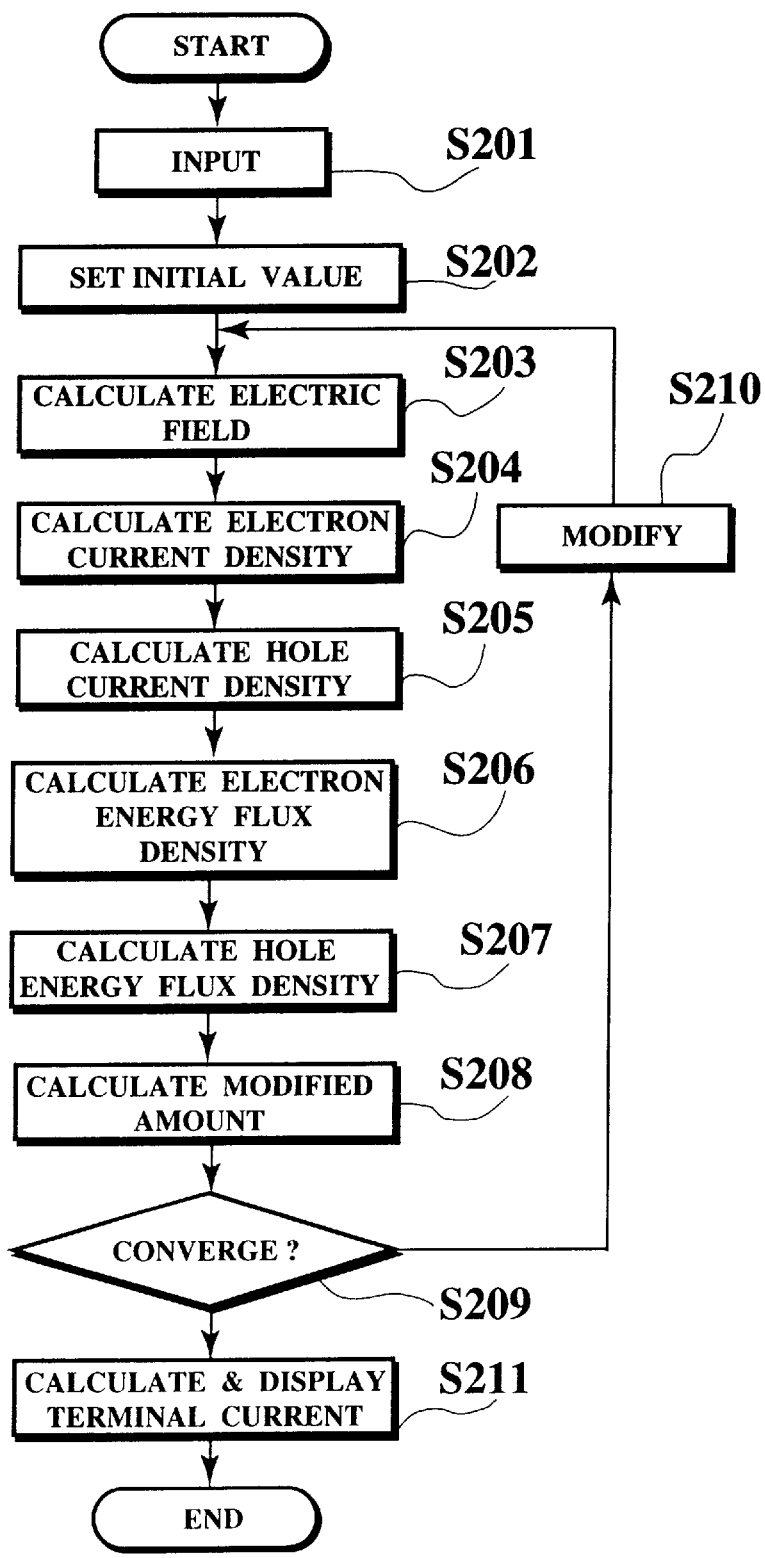
FIG. 9 is a flowchart of processing by a semiconductor-device simulation method related to the fourth embodiment of the present invention.

FIG. 9 is a flowchart of processing by semiconductor-device simulation methods related to the fourth embodiment of the present invention. To the flowchart of FIG. 5 are added step S206 for calculating an electron energy flux density and step S207 for calculating a hole energy flux density.

The processing executed at step S201 is the same as in the case of the above-mentioned first embodiment and therefore its description is omitted here.

In addition to the processing executed in the above-mentioned first embodiment, at step S202 for setting initial values, the room temperature is set at both the electron temperature $T_e$ and the hole temperature $T_h$ for each vertex.

The processing at step S203 for calculating the electric field may be the same as in the case of the above-mentioned first embodiment and therefore its description is omitted here.

In the processing at step S204 for calculating an electron current density, this density is calculated using Equation (53) described about the third embodiment. Where, by using electron temperature $T_{eBe}$ at point $B_e$, the thermal voltage $NV_e$ is given by $k \cdot T_{eBe}/(-q)$. And $F_{eI}'$ is calculated by the following equation (59) using an electron's thermal velocity $v_{eTHI}'$ at the point I'.

$$F_{eI}'=v_{eTHI}' \tag{59}$$

$F_{eJ}'$ is calculated by the following equation (60) using an electron's thermal velocity $v_{eTHJ}'$ at the point J'.

$$F_{eJ}'=v_{eTHJ}' \tag{60}$$

Also, $\lambda_e$ is calculated, using the electron Mobility $\mu_e$ (W) having energy W and the effective mass of electron $m^*_e$, by the following equation (61).

$$\lambda_e=2 \cdot \mu_e(W) \cdot m^*_e \cdot v_{eTH}/(-q) \tag{61}$$

where the electron Mobility $\mu_e$ (W) is given, using the electron momentum relaxation time $\tau_e$, by the following equation:

$$\mu_e(W)=-q \cdot \tau_e/(2 \cdot m^*_e) \tag{62}$$

Also, $n_I'$ and $n_J'$ are calculated much the same way as the above-mentioned third embodiment. And $v_{eTHI}'$ and $v_{eTHJ}'$ are calculated based on the electron's thermal velocities $v_{eTHI}$ and $v_{eTHJ}$ at the points I and J using much the same interpolation and extrapolation methods as $n_I'$ and $n_J'$, respectively.

At step S205 for calculating a hole's current density $J_{hIJ}$, this density is calculated using Equation (54) described in the third embodiment. Where, by using hole temperature $T_{hBe}$ at point $B_e$, the thermal voltage $NV_h$ is given by $k \cdot T_{hBe}/q$. Also, $F_{hI}'$ is calculated by the following equation (63) using a hole's thermal velocity $v_{hTHI}'$ at the point I'.

$$F_{hI}'=v_{hTHI}' \tag{63}$$

$F_{hJ}'$, on the other hand, is calculated by the following equation (64) using a hole's thermal velocity $v_{hTHJ}'$ at the point J'.

$$F_{hJ}'=v_{hTHJ}' \tag{64}$$

And, $\lambda_h$ is calculated, using the hole mobility $\mu_h$ (W) having energy W and the effective mass of hole $m^*_h$, by the following equation (65)

$$\lambda_h=2 \cdot \mu_h(W) \cdot m^*_h \cdot v_{hTH}/q \tag{65}$$

where the hole mobility $\mu_h$ (W) is given, using the hole momentum relaxation time $\tau_h$, by the following equation:

$$\mu_h(W)=q \cdot \tau_h/(2 \cdot m^*_h) \tag{66}$$

Also, $p_I'$ and $p_J'$ are calculated much the same way as the above-mentioned third embodiment. And, $v_{hTHI}'$ and $v_{hTHJ}'$ are calculated based on the hole's thermal velocities at the points I and J using much the same interpolation and extrapolation methods as $p_I'$ and $p_J'$, respectively.

In the processing at step S206 for calculating an electron energy flux density, this density is calculated using the following equation (67).

$$S_{eIJ}=Q_e \cdot (G_{eI}' \cdot A(-\lambda_e \cdot E_{IJ}/NV_e) \cdot n_I' - G_{eJ}' \cdot A(\lambda_e \cdot E_{IJ}/NV_e) \cdot n_J') \tag{67}$$

Where, the thermal voltage $NV_e$ is defined by the electron temperature $T_{eBe}$ at point $B_e$. And the proportional coefficient $G_{eI}'$ is calculated using the following equation (68).

$$G_{eI}'=k\cdot T_{eI}'\cdot v_{eTHI}' \tag{68}$$

The proportional coefficient $G_{eJ}'$ is calculated using the following equation (69).

$$G_{eJ}'=k\cdot T_{eJ}'\cdot v_{eTHJ}' \tag{69}$$

In these equations, $T_{eI}'$ is an electron temperature at the above-mentioned point I', $v_{eTHI}'$ is an electron's thermal velocity at the point I', $T_{eJ}'$ is an electron temperature at the above-mentioned point J', and $v_{eTHJ}'$ is an electron's thermal velocity at the point J'. Also, $\lambda_e$ is calculated using Equation (61). The values of $n_I'$ and $n_J'$ may be calculated much the same way as the above-mentioned third embodiment. Also, $T_{eI}'$ and $T_{eJ}'$ are calculated based on the electron temperatures $T_{eI}$ and $T_{eJ}$ at the points I and J using much the same interpolation and extrapolation methods as $n_I'$ and $n_J'$, respectively. Both $v_{eTHI}'$ and $v_{eTHJ}'$ are calculated much the same way as with the above-mentioned step S204 for calculating the electron current density. The value of $Q_e$ is set at 2.5.

In the processing at step S207 for calculating a hole energy flux density, this density is calculated using the following equation (70).

$$S_{hIJ}=Q_h\cdot(G_{hI}'\cdot A(-\lambda_h\cdot E_{IJ}/NV_h)\cdot p_I'-G_{hJ}'\cdot A(\lambda_h\cdot E_{IJ}/NV_h)\cdot p_J') \tag{70}$$

Where the thermal voltage $NV_h$ is defined by the hole temperature $T_{hBe}$ at point $B_e$. And the proportional coefficient $G_{hI}'$, on the other hand, is calculated using the following equation (71).

$$G_{hI}'=k\cdot T_{hI}'\cdot v_{hTHI}' \tag{71}$$

And, the proportional coefficient $G_{hJ}'$ is calculated using the following equation (72).

$$G_{hJ}'=k\cdot T_{hJ}'\cdot v_{hTHJ}' \tag{72}$$

In these equations, $T_{hI}'$ is a hole temperature at the above-mentioned point I', $v_{hTHI}'$ is a hole's thermal velocity at the point I', $T_{hJ}'$ is a hole temperature at a point J', and $v_{hTHJ}'$ is a hole's thermal velocity at the point J'. Also, $\lambda_h$ is calculated using Equation (65). Moreover, $p_I'$ and $p_J'$ are calculated much the same way as the above-mentioned third embodiment. Also, $T_{hI}'$ and $T_{hJ}'$ are calculated based on the hole temperatures $T_{hI}$ and $T_{hJ}$ at the points I and J using much the same interpolation and extrapolation methods as $p_I'$ and $p_J'$, respectively. $v_{hTHI}'$ and $v_{hTHJ}'$ are calculated using much the same method as the above-mentioned step S205 for calculating the hole current density $J_{hIJ}$. The value of $Q_h$ is set at 2.5.

Next, the program performs step S208 for calculating modified amounts. At this step, the Newton method is used to calculate modified amounts $\Delta\Psi_I$, $\Delta\Psi_J$, $\Delta n_I$, $\Delta n_J$, $\Delta p_I$, $\Delta p_J$, $\Delta T_{eI}$, $\Delta T_{eJ}$, $\Delta T_{hI}$, and $\Delta T_{hJ}$ of $\Psi_I$, $\Psi_J$, $n_I$, $n_J$, $p_I$, $p_J$, $T_{eI}$, $T_{eJ}$, $T_{hI}$, and $T_{hJ}$ at each vertex respectively.

Next, the program performs step S209 for deciding convergence. At this step, the program decides convergence when the following five criteria are all satisfied and then goes to step S211 and otherwise, to step 210.

Criterion 1: The maximum absolute value of amounts $\Delta\Psi_I/NV_e$, $\Delta\Psi_J/NV_e$, $\Delta\Psi_I/NV_h$, and $\Delta\Psi_J/NV_h$ calculated for each vertex shall not exceed 0.01 (should preferably be 0.001 or less).

Criterion 2: The maximum absolute value of amounts $\Delta n_I/n_I$ and $\Delta n_J/n_J$ calculated for each vertex shall not exceed 0.01 (should preferably be 0.001 or less).

Criterion 3: The maximum absolute value of amounts $\Delta p_I/p_I$ and $\Delta p_J/p_J$ calculated for each vertex shall not exceed 0.01 (should preferably be 0.01 or less).

Criterion 4: The maximum absolute value of amounts $\Delta T_{eI}/T_{eI}$ and $\Delta T_{eJ}/T_{eJ}$ calculated for each vertex shall not exceed 0.01 (should preferably be 0.001 or less).

Criterion 5: The maximum absolute value of amounts $\Delta T_{hI}/T_{hI}$ and $\Delta T_{hJ}/T_{hJ}$ calculated for each vertex shall not exceed 0.01 (should preferably be 0.001 or less).

If the above-mentioned five criteria are all satisfied at the above-mentioned step S209 for deciding convergence, the program performs step S211 for terminal current calculation and display and then puts an end to its processing. At step S211 for terminal current calculation and display, the program calculates terminal currents for each electrode. Specifically, a terminal current is calculated by multiplying a current density by the surface area of an electrode. The values of thus calculated terminal currents are displayed on the screen in the order of the electrode number.

If it has gone to step S210 based on the results of performing the above-mentioned step S209 for deciding convergence, on the other hand, the program adds modified amounts $\Delta\Psi_I$, $\Delta\Psi_J$, $\Delta n_I$, $\Delta n_J$, $\Delta p_I$, $\Delta p_J$, $\Delta T_{eI}$, $\Delta T_{eJ}$, $\Delta T_{hI}$, and $\Delta T_{hJ}$ to $\Psi_I$, $\Psi_J$, $n_I$, $n_J$, $p_I$, $p_J$, $T_{eI}$, $T_{eJ}$, $T_{hI}$, and $T_{hJ}$ for each vertex respectively and then returns to step S203.

Figure 10:
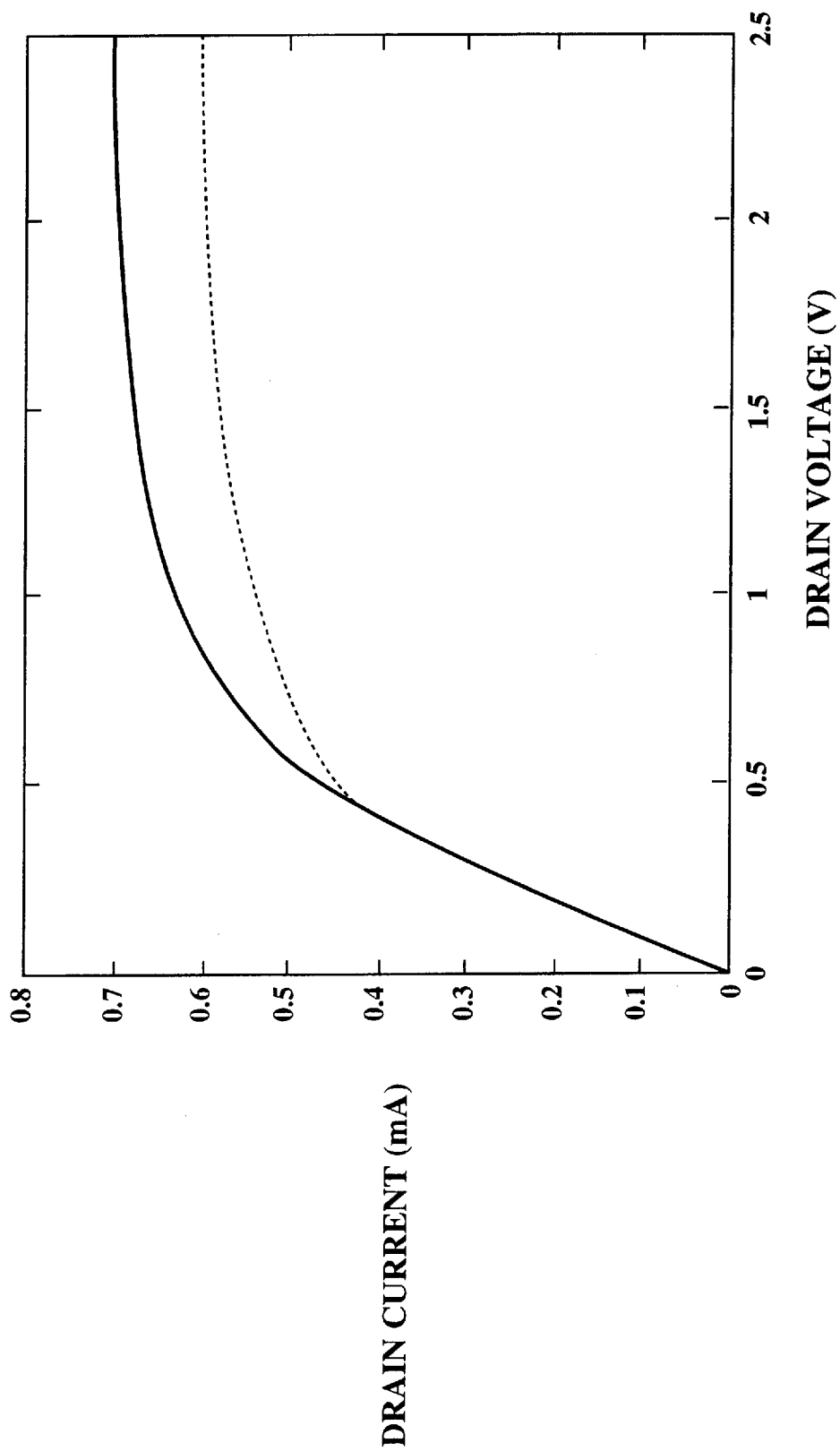
FIG. 10 is a graph showing the characteristics of a semiconductor calculated by the fourth embodiment(solid line) and the first embodiment(dotted line) of the present invention.

FIG. 10 is a graph showing the drain current vs. Drain voltage characteristics of a semiconductor device (MOSFET). In the figure, the solid line represents the characteristics of an MOSFET obtained by the fourth embodiment of the present invention and the dotted line, the characteristics of an MOSFET obtained by the first embodiment. In the fourth embodiment, an electron temperature $T_e$ and a hole temperature $T_h$ are evaluated, so that a larger amount of calculations have to be performed than the first embodiment, thus resulting in a problem of a longer time required for device simulation. The fourth embodiment, however, is able to obtain the simulated results with a higher accuracy as a result of detailed calculations. This leads to decreases in the period of designing, thereby reducing the period of fabricating semiconductor devices.

Also, it has been found that by the fourth embodiment of the present invention, the simulated results almost coincide with the actual measurements (not shown) even at such an operation point of semiconductor device providing a larger current and, therefore, requiring a stronger electric field. The fourth embodiment, therefore, makes it possible to evaluate the electrical characteristics of the recent short-gate-length MOSFETs and other semiconductor devices having a strong electric field with a good accuracy.

As mentioned above, with the semiconductor-device simulation method according to the fourth embodiment of the present invention, it is possible to rapidly and stably obtain the device behavior which cannot be done so by the prior art because of numeric errors. Also, such an expansion of the terminal voltage of the semiconductor device does mean improvements in the accuracy of a device simulator. Thus the improved accuracy shortens the design period and then the fabricating period of the semiconductor devices.

DEVICE FABRICATION

Figure 11:
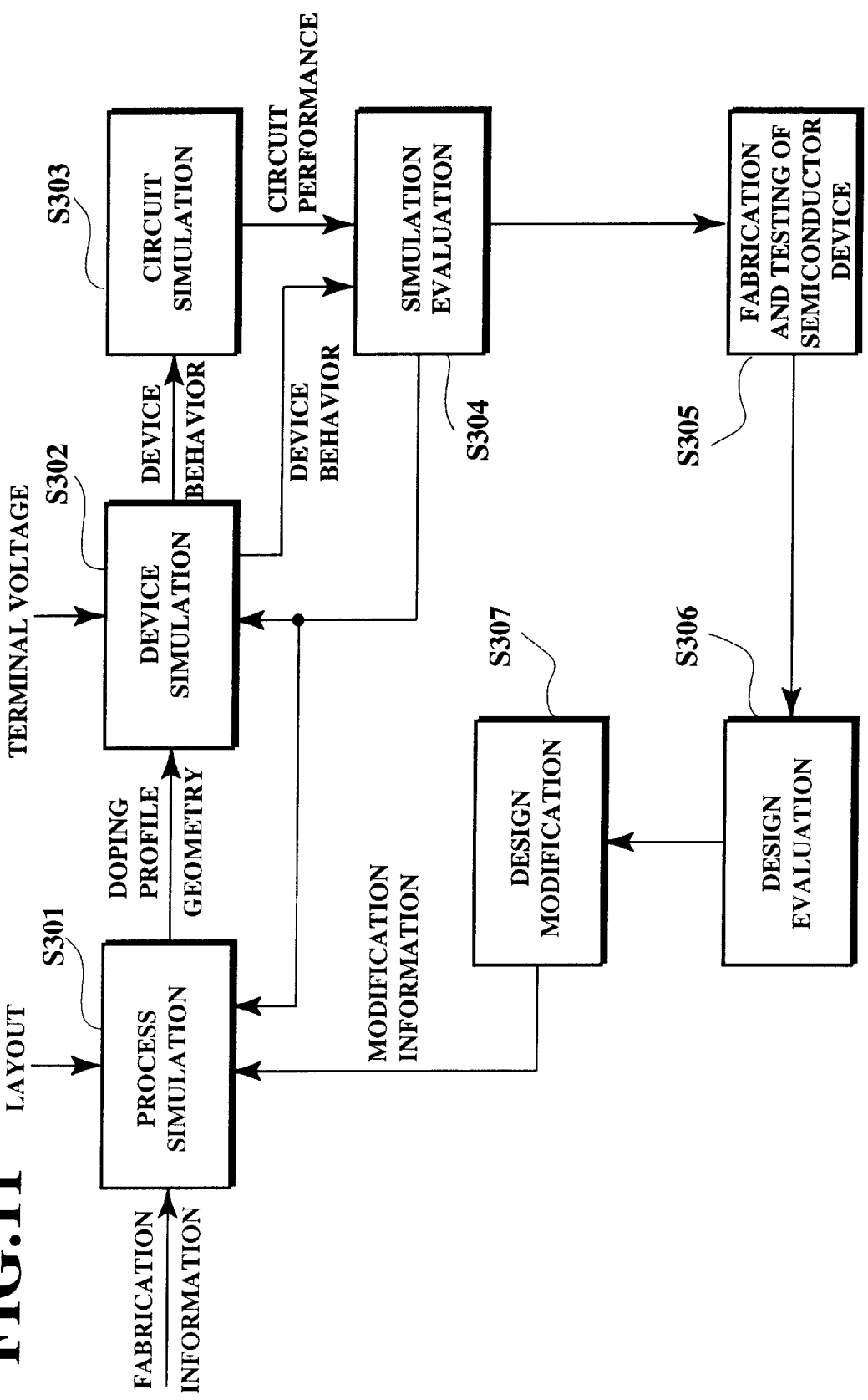
FIG. 11 is a flowchart of fabricating a semiconductor device by the present invention.

FIG. 11 is a flowchart showing the processes of fabricating LSIs or other semiconductor devices by use of a semiconductor-device simulation method related to any of the above-mentioned first through fourth embodiments. As shown in FIG. 11, the impurity distribution profiles (doping profiles) and other data including the geometry and sizes of an objective semiconductor device obtained by process simulations including such as a diffusion and geometry simulations (step S301) are immediately input into a device simulation process (step S302) described in the first through fourth embodiments, at which process the device behaviors including voltage vs. current characteristics, impedance characteristics, and high-frequency characteristics can be obtained. A device simulation described in the above-mentioned first through fourth embodiments makes it possible to obtain rapidly and accurately the these device behaviors.

Before the device simulation starts (step S302), terminal voltages, terminal currents, and other data of electrical boundary conditions are input together with the semiconductor device structure and the impurity distribution profiles obtained as a result of the process simulation (step S301). If required, moreover, the device behaviors obtained as a result of the device simulation (step S302) may be given as input data for circuit simulation (step S303). so that a circuit simulator would provide circuit performances. At step S305, it is decided whether the device behavior obtained by the device simulation (step S302) or the circuit performance obtained by the circuit simulation (step S303) provide desired results. If it is decided affirmatively, the program starts the process of fabricating the actual objective semiconductor device (step S305). At step S305, various processes are performed such as ion implantation, predeposition, drive-in, annealing, epitaxy and other diffusion processes to realize impurity distribution profiles inside the semiconductor device obtained by the diffusion simulation at step S301 or photolithography process, thin film formation process such as chemical vapor deposition (CVD), epitaxy, evaporation and sputtering, etching process such as reactive ion etching (RIE), ion milling and wet chemical etching, selective diffusion process, and other desired processes to realize the geometry and sizes of various parts of the semiconductor device obtained by the geometry simulation at step S301. If, on the other hand, it is decided at step S304 that the desired characteristics cannot be provided and therefore the desired semiconductor cannot be realized by thus worked out fabrication processes, the conditions of the process simulation or the procedure itself including the process order are changed to perform process simulation again (step S301). Then, the results of thus modified process simulation (step S301) are input as data, to perform device simulation (step S302). If, at step S302, the device simulation results in "affirmatively accepted," a series of fabrication processes are performed such as the ion implantation, diffusion, oxidization, photolithography, thin film formation such as CVD and epitaxy, and etching processes such as RIE, ion milling and wet chemical etching. Then, the characteristics of the real objective semiconductor device obtained as a result of this series of fabrication processes are measured, to evaluate the relevant design (step S306). If, at step S306, the characteristics of this actually fabricated semiconductor device do not satisfy the required specification, the design is modified (step S307) to start new process simulation (step S301). Subsequently, as mentioned earlier, the results of this new process simulation (step S301) are input as data, to perform a new device simulation (step S302), which is followed by new steps S303, S304, S305, and S306 in this order in a repetitive loop.

The actual situation in the recent semiconductor industry is such that the competitors are earnestly trying to reduce the period of research, development, and fabrication of LSIs and other fine-patterned semiconductor devices. The present invention will shorten the period of the loop ranging, as shown in FIG. 11, from the process simulation (step S301), the device simulation (step S302), and other processes of design, trial fabrication, to development of the semiconductor devices.

As can be seen from the above description, by employing the semiconductor-device fabrication method, the device simulator, the device simulation method, and the storage medium storing the simulation program according to the present invention, the behavior and performance of such a semiconductor device that satisfies a prescribed accuracy can be obtained rapidly and stably, to reduce the design period as well as the period of fabricating LSIs, high-frequency transistors, and other semiconductor devices.

Various modifications will become possible for those skilled in the art after receiving the teachings of the present disclosure without departing from the scope thereof.

What is claimed is:

1. A method for fabricating a semiconductor device, comprising the steps of:

(a) designing a geometry of the semiconductor device and a donor impurity concentration and an acceptor impurity concentration at each point inside the semiconductor device;

(b) inputting said geometry and said donor and said acceptor impurity concentrations at each point inside the semiconductor device together with terminal voltages of the semiconductor device, to obtain electron concentrations and hole concentrations at each point inside the semiconductor device and also a voltage difference $\Psi_{dd}$ across a prescribed segment dd along a segment IJ connecting given points I and J inside the semiconductor device, and to calculate an electron current density $J_{eIJ}$ of said segment IJ based on a constant $C_{eI}$ related to said point I, a constant $C_{eJ}$ related to said point J, and a voltage difference ($\Phi_{edd}=\Psi_{dd}/NV_e$) across said segment dd normalized by an electron's thermal voltage ($NV_e = k \cdot T_e/(-q)$) using an equation:

$$J_{eIJ} = C_{eI} \cdot A(\Phi_{edd}) - C_{eJ} \cdot A(-\Phi_{edd}),$$

and also to calculate a hole current density $J_{hIJ}$ of said segment IJ based on a constant $C_{hI}$ related to said point I, a constant $C_{hJ}$ related to said point J, and a voltage difference ($\Phi_{hdd}=\Psi_{dd}/NV_h$) across said segment dd normalized by a hole's thermal voltage ($NV_h = k \cdot T_h/q$) using an equation:

$$J_{hIJ} = C_{hI} \cdot A(\Phi_{hdd}) - C_{hJ} \cdot A(-\Phi_{hdd}),$$

thus evaluating behavior of the semiconductor device; and (c) fabricating the semiconductor device, if a desired device behavior is obtained at said evaluation step (b), by performing a series of fabrication processes including an impurity doping, a thin-film forming, a photolithography, and an etching processes in order to realize said geometry, said donor and said acceptor impurity concentrations, wherein $A(\Phi)=1/(\exp(\Phi)+1)$.

2. The method of claim 1, wherein said electron concentrations for giving said constants $C_{eI}$ and $C_{eJ}$ are electron concentrations $n_I$ and $n_J$ at points I and J, respectively, and said hole concentrations for giving said constants $C_{hI}$ and $C_{hJ}$ are hole concentrations $p_I$ and $p_J$ at the points I and J respectively and also said voltage difference $\Psi_{dd}$ is a voltage difference $\Psi_{IJ}$ across said segment IJ.

3. The method of claim 1, wherein said electron concentrations for giving said constants $C_{eI}$ and $C_{eJ}$ are electron concentrations $n_I'$ and $n_J'$ at points I' and J' distant by ½ of an electron mean free path $\lambda_e$ from a point $B_e$ on the segment IJ along the directions to the points I and J, respectively, said hole concentrations for giving said constants $C_{hI}$ and $C_{hJ}$ are hole concentrations $p_I'$ and $p_J'$ at the points I' and J' distant by ½ of a hole mean free path $\lambda_h$ from a point $B_h$ on the segment IJ along the directions to the points I and J, respectively, and said voltage difference $\Psi_{dd}$ across the prescribed segment dd is a voltage difference $\Psi^{\lambda}{}_e$ across said electron mean free path $\lambda_e$ for electrons and a voltage difference $\Psi^{\lambda}{}_h$ across said hole mean free path $\lambda_h$ for holes.

4. A semiconductor device simulator comprising:
   (a) an input unit which inputs a geometry of a semiconductor device, a donor impurity concentration and an acceptor impurity concentration at each point inside the semiconductor device and also terminal voltages of the semiconductor device;
   (b) an obtaining unit which obtains electron concentrations and hole concentrations at each point inside the semiconductor device and also a voltage difference $\Psi_{dd}$ across a prescribed segment dd along a segment IJ connecting given points I and J inside the semiconductor device;
   (c) a calculation unit which calculates an electron current density $J_{eIJ}$ of said segment IJ based on a constant $C_{eI}$ related to said point I, a constant $C_{eJ}$ related to said point J, and a voltage difference $(\Phi_{edd}=\Psi_{dd}/NV_e)$ across said segment dd normalized by an electron's thermal voltage $(NV_e=k \cdot T_e/(-q))$ using an equation:

$$J_{eIJ}=C_{eI} \cdot A(\Phi_{edd})-C_{eJ} \cdot A(-\Phi_{edd})$$

and also which calculates a hole current density $J_{hIJ}$ of said segment IJ based on a constant $C_{hI}$ related to said point I, a constant $C_{hJ}$ related to said point J, and a voltage difference $(\Phi_{hdd}=\Psi_{dd}/NV_h)$ normalized by a hole's thermal voltage $(NV_h=k \cdot T_h/q)$ using an equation:

$$J_{hIJ}=C_{hI} \cdot A(\Phi_{hdd})-C_{hJ} \cdot A(-\Phi_{hdd});$$

(d) an evaluation unit which evaluates the behavior of said semiconductor device using said electron current density $J_{eIJ}$ and said hole current density $J_{hIJ}$; and
   (e) an output unit which outputs a terminal current of said semiconductor device and the results of said evaluation,
   wherein $A(\Phi)=1/(\exp(\Phi)+1)$.

5. The simulator of claim 4, wherein said electron concentrations for giving said constants $C_{eI}$ and $C_{eJ}$ are electron concentrations $n_I$ and $n_J$ and said hole concentrations for giving said constants $C_{hI}$ and $C_{hJ}$ are hole concentrations $p_I$ and $p_J$ at the points I and J, respectively, and also said voltage difference $\Psi_{dd}$ across the segment dd is a voltage difference $\Psi_{IJ}$ across said segment IJ.

6. The simulator of claim 4, wherein said electron concentrations for giving said constants $C_{eI}$ and $C_{eJ}$ are electron concentrations $n_I'$ and $n_J'$ at points I' and J' distant by ½ of an electron mean free path $\lambda_e$ from a point $B_e$ on the segment IJ along the directions to the points I and J, respectively, said hole concentrations for giving said constants $C_{hI}$ and $C_{hJ}$ are hole concentrations $p_I'$ and $p_J'$ at the points I' and J' distant by ½ of a hole mean free path $\lambda_h$ from a point $B_h$ on the segment IJ along the directions to the points I and J, and said voltage difference $\Psi_{dd}$ across a prescribed segment dd is a voltage difference $\Psi^{\lambda}{}_e$ across said electron mean free path $\lambda_e$ for electrons and a voltage difference $\Psi^{\lambda}{}_h$ across said hole mean free path $\lambda_h$ for holes.

7. A method for simulating a semiconductor device comprising the steps of:
   (a) inputting a geometry of the semiconductor device, a donor impurity concentration and an acceptor impurity concentration at each point inside the semiconductor device and also terminal voltages of the semiconductor device;
   (b) setting initial values by obtaining electron concentrations, hole concentrations, and a potential at each point inside the semiconductor device;
   (c) obtaining a voltage difference $\Psi_{dd}$ across a prescribed segment dd along a segment IJ connecting given points I and J inside the semiconductor device;
   (d) calculating an electron current density $J_{eIJ}$ of said segment IJ using a constant $C_{eI}$ related to said point I, a constant $C_{eJ}$ related to said point J, and a voltage difference $(\Phi_{edd}=\Psi_{dd}/NV_e)$ across said segment dd normalized by an electron's thermal voltage $(NV_e=k \cdot T_e/(-q))$ using an equation:

$$J_{eIJ}=C_{eI} \cdot A(\Phi_{edd})-C_{eJ} \cdot A(-\Phi_{edd});$$

(e) calculating a hole current density $J_{hIJ}$ of said segment IJ based on a constant $C_{hI}$ related to said point I, a constant $C_{hJ}$ related to said point J, and a voltage difference $(\Phi_{hdd}=\Psi_{dd}/NV_h)$ across said segment dd normalized by a hole's thermal voltage $(NV_h=k \cdot T_h/q)$ using an equation:

$$J_{hIJ}=C_{hI} \cdot A(\Phi_{hdd})-C_{hJ} \cdot A(-\Phi_{hdd}); \text{ and}$$

(f) outputting a terminal current of said semiconductor device,
   wherein $A(\Phi)=1/(\exp(\Phi)+1)$.

8. The method of claim 7, wherein said electron concentrations for giving said constants $C_{eI}$ and $C_{eJ}$ are electron concentrations $n_I$ and $n_J$ and said hole concentrations for giving said constants $C_{hI}$ and $C_{hJ}$ are hole concentrations $p_I$ and $p_J$ at the points I and J, respectively, and also said voltage difference $\Psi_{dd}$ across the segment dd is a voltage difference $\Psi_{IJ}$ across said segment IJ.

9. The method of claim 8, wherein said constants $C_{eI}$, $C_{eJ}$, $C_{hI}$, and $C_{hJ}$ are obtained by the following equations using elementary charge q, proportional coefficients $F_{eI}$, $F_{eJ}$, $F_{hI}$, $F_{hJ}$ and said concentrations $n_I$, $n_J$, $p_I$, $p_J$:

$C_{eI}=-q \cdot F_{eI} \cdot n_I$
$C_{eJ}=-q \cdot F_{eJ} \cdot n_J$
$C_{hI}=q \cdot F_{hI} \cdot p_I$
$C_{hJ}=q \cdot F_{hJ} \cdot p_J.$ 10. The method of claim 9, wherein
    said proportional coefficients $F_{eI}$, $F_{eJ}$, $F_{hI}$, and $F_{hJ}$ are obtained by the following equations using a low field electron mobility $\mu_{ewIJ}$ and a low field hole mobility $\mu_{hwIJ}$, a length $d_{IJ}$ of the segment IJ and said thermal voltages $NV_e$ and $NV_h$:

$F_{eI}=F_{eJ}=F_{eIJ}=2(\mu_{ewIJ}/d_{IJ}) \cdot NV_e$
    $F_{hI}=F_{hJ}=F_{hIJ}=2(\mu_{hwIJ}/d_{IJ}) \cdot NV_h$; and said $\mu_{ewIJ}$ is a negative value of the electron mobility, while $\mu_{hwIJ}$ is a positive value of the hole mobility.

11. The method of claim 9, wherein said proportional coefficients $F_{eI}$ and $F_{eJ}$ are calculated by the following equation using an electron's saturated drift velocity $v_{esatIJ}$ along the segment IJ:

$F_{eI}=F_{eJ}=F_{eIJ}=v_{esatIJ}$ and said proportional coefficients $F_{hI}$ and $F_{hJ}$ are calculated by the following equation using a hole's saturated drift velocity $v_{hsatIJ}$ along the segment IJ:

$F_{hI}=F_{hJ}=F_{hIJ}=v_{hsatIJ}.$

12. The method of claim 9, wherein said proportional coefficients $F_{eI}$, $F_{eJ}$, $F_{hI}$, and $F_{hJ}$ are obtained by the following equations using a low field electron mobility $\mu_{ewI}$ and a low field hole mobility $\mu_{hwI}$ at the point I, a low field electron mobility $\mu_{ewJ}$ and a low field hole mobility $\mu_{hwJ}$ at the point J, a length $d_{IJ}$ of the segment IJ and said thermal voltages $NV_e$ and $NV_h$:

$F_{eI}=2\cdot(\mu_{ewI}/d_{IJ})\cdot NV_e$ $F_{eJ}=2\cdot(\mu_{ewJ}/d_{IJ})\cdot NV_e$ $F_{hI}=2\cdot(\mu_{hwI}/d_{IJ})\cdot NV_h$ $F_{hJ}=2\cdot(\mu_{hwJ}/d_{IJ})\cdot NV_h$; and said $\mu_{ewI}$ and $\mu_{ewJ}$ are negative values of the electron mobility, while $\mu_{hwI}$ and $\mu_{hwJ}$ are positive values of the hole mobility.

13. The method of claim 9, wherein said proportional coefficients $F_{eI}$ and $F_{eJ}$ are calculated by the following equations based on electron's saturated drift velocities $v_{esatI}$ and $v_{esatJ}$ at the points I and J respectively:

$F_{eI}=v_{esatI}$ $F_{eJ}=v_{esatJ}$ and said proportional coefficients $F_{hI}$ and $F_{hJ}$ are calculated by the following equations based on hole's saturated drift velocities $v_{hsatI}$ and $v_{hsatJ}$ at the points I and J respectively:

$F_{hI}=v_{esatI}$ $F_{hJ}=v_{esatJ}$.

14. The method of claim 10, wherein said length $d_{IJ}$ is calculated by the following equation based on said electron mean free path $\lambda_e$ along the segment IJ:

$d_{IJ}=\lambda_e$.

15. The method of claim 11, wherein a length $d_{IJ}$ of the segment IJ is calculated by the following equation based on said electron mean free path along the segment IJ:

$d_{IJ}=\lambda_e$.

16. The method of claim 12, wherein said length $d_{IJ}$ is calculated by the following equation based on said electron mean free path $\lambda_e$ along the segment IJ:

$d_{IJ}=\lambda_e$.

17. The method of claim 13, wherein a length $d_{IJ}$ of the segment IJ is calculated by the following equation based on said electron mean free path along the segment IJ:

$d_{IJ}=\lambda_e$.

18. The method of claim 7, wherein said electron concentrations for giving said constants $C_{eI}$ and $C_{eJ}$ are electron concentrations $n_I'$ and $n_J'$ at points I' and J' distant by ½ of an electron mean free path from a point $B_e$ on the segment IJ along the directions to the points I and J, respectively, said hole concentrations for giving said constants $C_{hI}$ and $C_{hJ}$ are hole concentrations $p_I'$ and $p_J'$ at the points I' and J' distant by ½ of a hole mean free path from a point $B_h$ on the segment IJ along the directions to the points I and J, and said voltage difference $\Psi_{dd}$ across a prescribed segment dd is a voltage difference $\Psi^\lambda_e$ across said electron mean free path $\lambda_e$ for electrons and a voltage difference $\Psi^\lambda_h$ across said hole mean free path for holes.

19. The method of claim 18, wherein said constants $C_{eI}$, $C_{eJ}$, $C_{hI}$, and $C_{hJ}$ are obtained by the following equations using elementary charge q, proportional coefficients $F_{eI}'$, $F_{eJ}'$, $F_{hI}'$, $F_{hJ}'$, and said concentrations $n_I'$, $n_J'$, $p_I'$, $p_J'$:

$C_{eI}=-q\cdot F_{eI}'\cdot n_I'$ $C_{eJ}=-q\cdot F_{eJ}'\cdot n_J'$ $C_{hI}=q\cdot F_{hI}'\cdot p_I'$ $C_{hJ}=q\cdot F_{hJ}'\cdot p_J'$.

20. The method of claim 19, wherein said proportional coefficients $F_{eI}'$ and $F_{eJ}'$ are calculated by the following equations using en electron's saturated drift velocity $v_{esatBe}$ at said point $B_e$:

$F_{eI}'=F_{eJ}'=F_{eIJ}'=v_{satBe}$ and said proportional coefficients $F_{hI}'$ and $F_{hJ}'$ are calculated by the following equation using a hole's saturated drift velocity $v_{hsatBh}$ at said point $B_h$:

$F_{hI}'=F_{hJ}'=F_{hIJ}'=v_{satBh}$.

21. The method of claim 19, wherein said proportional coefficient $F_{eI}'$ is calculated by the following equation using an electron's saturated drift velocity $v_{esatI}'$ at said point I':

$F_{eI}'=v_{esatI}'$, said proportional coefficient $F_{eJ}'$ is calculated by the following equation using an electron's saturated drift velocity $v_{esatJ}'$ at said point J':

$F_{eJ}'=v_{esatJ}'$, said proportional coefficient $F_{hI}'$ is calculated by the following equation using a hole's saturated drift velocity $v_{hsatI}'$ at said point I':

$F_{hI}'=v_{hsatI}'$, and said proportional coefficient $F_{hJ}'$ is calculated by the following equation using a hole's saturated drift velocity $v_{hsatJ}'$ at said point J':

$F_{hJ}'=v_{hsatJ}'$.

22. The method of claim 18, wherein said electron mean free path $\lambda_e$ is calculated by the following equation using a low field electron mobility $\mu_{ewIJ}$, an electron's saturated drift velocity $v_{esatBe}$ at the point $B_e$ and said thermal voltage $NV_e$:

$\lambda_e=2\cdot\mu_{ewIJ}\cdot NV_e/v_{esatBe}$ and said hole mean free path $\lambda_h$ is calculated by the following equation using a low field hole mobility $\mu_{hwIJ}$, a hole's saturated drift velocity $v_{hsatBh}$ at the point $B_h$ and said thermal voltage $NV_h$:

$\lambda_h=2\cdot\mu_{hwIJ}\cdot NV_h/v_{hsatBh}$.

23. The method of claim 18, comprising the additional step of calculating an electron energy flux density $S_{eIJ}$ and a hole energy flux density $S_{hIJ}$ along said segment IJ by the following equations using an electron's effective flow factor $Q_e$, a hole's effective flow factor $Q_h$, proportional coefficients $G_{eI}'$, $G_{eJ}'$, $G_{hI}'$, $G_{hJ}'$, an electric field $E_{IJ}$ measured from the point I to the point J, said thermal voltages $NV_e$, $NV_h$ and said concentrations $n_I'$, $n_J'$, $p_I'$, $p_J'$:

$S_{eIJ}=Q_e\cdot(G_{eI}'\cdot A(-\lambda_e E_{IJ}/NV_e)\cdot n_I'-G_{eJ}'\cdot A(\lambda_e\cdot E_{IJ}/NV_e)\cdot n_J')$ $S_{hIJ}=Q_h\cdot(G_{hI}'\cdot A(-\lambda_h E_{IJ}/NV_h)\cdot p_I'-G_{hJ}'\cdot A(\lambda_h\cdot E_{IJ}/NV_h)\cdot p_J')$.

24. The method of claim 23, wherein said constants $C_{eI}$, $C_{eJ}$, $C_{hI}$, and $C_{hJ}$ are obtained by following equations using elementary charge q, proportional coefficients $F_{eI}'$, $F_{eJ}'$, $F_{hI}'$, $F_{hJ}'$, and said concentrations $n_I'$, $n_J'$, $p_I'$, $p_J'$:

$C_{eI}=-q\cdot F_{eI}'\cdot n_I'$ $C_{eJ}=-q\cdot F_{eJ}'\cdot n_J'$ $C_{hI}=q\cdot F_{hI}'\cdot p_I'$ $C_{hJ}=q\cdot F_{hJ}'\cdot p_J'$.

25. The method of claim 24, wherein said proportional coefficient $F_{eI}'$ is calculated by the following equation using an electron's thermal velocity $v_{eTHI}'$ at said point I':

$F_{eI}'=v_{eTHI}'$, said proportional coefficient $F_{eJ}'$ is calculated by the following equation using an electron's thermal velocity $v_{eTHJ}'$ at said point J':

$F_{eJ}'=v_{eTHJ}'$, said proportional coefficient $F_{hI}'$ is calculated by the following equation using a hole's thermal velocity $v_{hTHI}'$ at said point I':

$F_{hI}'=v_{hTHI}'$, and said proportional coefficient $F_{hJ}'$ is calculated by the following equation using a hole's thermal velocity $v_{hTHJ}'$ at said point J':

$F_{hJ}'=v_{hTHJ}'$.

26. The method of claim 23, wherein said proportional coefficients $G_{eI}'$, $G_{eJ}'$, $G_{hI}'$, and $G_{hJ}'$ are obtained by the following equations respectively:

$$G_{eI}'=k \cdot T_{eI}' \cdot v_{eTHI}'$$
$$G_{eJ}'=k \cdot T_{eJ}' \cdot v_{eTHJ}'$$
$$G_{hI}'=k \cdot T_{hI}' \cdot v_{hTHI}'$$
$$G_{hJ}'=k \cdot T_{hJ}' \cdot v_{hTHJ}'$$

where k is Boltzmann's constant, $T_{eI}'$ is an electron temperature at said point I', $v_{eTHI}'$ is an electron's thermal temperature at said point I', $T_{eJ}'$ is an electron temperature at said point J', $v_{eTHJ}'$ is an electron's thermal velocity at said point J', $T_{hI}'$ is a hole temperature at said point I', $v_{hTHI}'$ is a hole's thermal velocity at said point I', $T_{hJ}'$ is a hole temperature at said point J', and $V_{hTHJ}$ is a hole's thermal velocity at said point J'.

27. The method of claim 23, wherein said electron mean free path $\lambda_e$ is obtained by the following equations:

$$\lambda_e = 2 \cdot \mu_e(W) \cdot m^*_e \cdot v_{eTH}/(-q)$$

$$\mu_e(W) = -q \tau_e/(2 \cdot m^*_h)$$

and said hole mean free path $\lambda_h$ is obtained by the following equations:

$$\lambda_h = 2 \cdot \mu_h(W) \cdot m^*_h \cdot v_{hTH}/q$$

$$\mu_h(W) = q \tau_h/(2 \cdot m^*_h)$$

where $\mu_e(W)$ is a mobility of an electron having energy W, $\mu_h(W)$ is a mobility of a hole having energy W, $\tau_e$ and $\tau_h$ are momentum relaxation times of an electron and a hole respectively, $m^*_e$ and $m^*_h$ are effective masses of an electron and a hole respectively, $v_{eTH}$ and $v_{hTH}$ are thermal velocities of an electron and a hole respectively, and q is elementary charge.

28. A storage medium storing a program being executed on a device simulator of a semiconductor device, the program comprising the steps of:

(a) inputting a geometry of the semiconductor device, a donor impurity concentration and an acceptor impurity concentration at each point inside the semiconductor device, and terminal voltages of the semiconductor device;

(b) setting initial values by obtaining an electron concentration, a hole concentration, and a potential at each point inside the semiconductor device;

(c) obtaining a voltage difference $\Psi_{dd}$ across a prescribed segment dd along a segment IJ connecting given points I and J inside the semiconductor device;

(d) calculating an electron current density $J_{eIJ}$ of said segment IJ by the following equation using a constant $C_{eI}$ related to said point I, a constant $C_{eJ}$ related to said point J, and a voltage difference ($\Phi_{edd}=\Psi_{dd}/NV_e$) across said segment dd normalized by an electron's thermal voltage ($NV_e=k \cdot T_e(-q)$):

$$J_{eIJ}=C_{eI} \cdot A(\Phi_{edd}) - C_{eJ} \cdot A(-\Phi_{edd});$$

(e) calculating a hole current density $J_{hIJ}$ of said segment IJ by the following equation using a constant $C_{hI}$ related to said point I, a constant $C_{hJ}$ related to said point J, and a voltage difference ($\Phi_{hdd}=\Psi_{dd}/NV_h$) across said segment dd normalized by a hole's thermal voltage ($NV_h=k \cdot T_h/q$):

$$J_{hIJ}=C_{hI} \cdot A(\Phi_{hdd}) - C_{hJ} \cdot A(-\Phi_{hdd});$$ and (f) outputting a terminal current of said semiconductor device, wherein $A(\Phi) = 1/(\exp(\Phi)+1)$.

29. The storage medium of claim 28, wherein said electron concentrations for giving said constants $C_{eI}$ and $C_{eJ}$ are electron concentrations $n_I$ and $n_J$ and said hole concentrations for giving said constants $C_{hI}$ and $C_{hJ}$ are hole concentrations $p_I$ and $p_J$ at the points I and J, respectively, and also said voltage difference $\Psi dd$ is a voltage difference $\Psi_{IJ}$ across said segment IJ.

30. The method of claim 28, wherein said electron concentrations for giving said constants $C_{eI}$ and $C_{eJ}$ are electron concentrations $n_I'$ and $n_J'$ at points I' and J' distant by ½ of an electron mean free path $\lambda_e$ from a point $B_e$ on the segment IJ along the directions to the points I and J, respectively, said hole concentrations for giving said constants $C_{hI}$ and $C_{hJ}$ are hole concentrations $p_I'$ and $p_J'$ at the points I' and J' distant by ½ of a hole mean free path $\lambda_h$ from a point $B_h$ on the segment IJ along the directions to the points I and J, and said voltage difference $\Psi_{dd}$ across a prescribed segment dd is a voltage difference $\Psi^\lambda_e$ across said electron mean free path $\lambda_e$ for electrons and a voltage difference $\Psi^\lambda_h$ across said hole mean free path $\lambda_h$ for holes.

31. The storage medium of claim 28, comprising the additional step of calculating an electron energy flux density $S_{eIJ}$ and a hole energy flux density $S_{hIJ}$ along said segment IJ by the following equations using an electron's effective flow factor $Q_e$, a hole's effective flow factor $Q_h$, proportional coefficients $G_{eI}'$, $G_{eJ}'$, $G_{hI}'$, $G_{hJ}'$, an electric field $E_{IJ}$ measured from the point I to the point J, said thermal voltages $NV_e$, $NV_h$ and said concentrations $n_I'$, $n_J'$, $p_I'$, $p_J'$:

$$S_{eIJ}=Q_e \cdot (G_{eI}' \cdot A(-\lambda_e \cdot E_{IJ}/NV_e) \cdot n_I' - G_{eJ}' \cdot A(\lambda_e \cdot E_{IJ}/NV_e) \cdot n_J')$$

$$S_{hIJ}=Q_h \cdot (G_{hI}' \cdot A(-\lambda_h \cdot E_{IJ}/NV_h) \cdot p_I' - G_{hJ}' \cdot A(\lambda_h \cdot E_{IJ}/NV_h) \cdot p_J').$$

* * * * *

UNITED STATES PATENT AND TRADEMARK OFFICE
CERTIFICATE OF CORRECTION

PATENT NO.   : 5,889,687
DATED        : March 30, 1999
INVENTOR(S)  : Toshiyuki ENDA It is certified that error appears in the above-indentified patent and that said Letters Patent is hereby corrected as shown below:

On the title page, insert the following:

[30]    Foreign Application Priority Data

Apr. 18, 1997  [JP]  Japan ................P09-102016
      Apr. 10, 1998  [JP]  Japan ................P10-99536

Signed and Sealed this

Twenty-third Day of November, 1999

Attest:

Q. TODD DICKINSON

*Attesting Officer*    *Acting Commissioner of Patents and Trademarks*